(12) United States Patent
Smith et al.

(10) Patent No.: US 7,544,449 B1
(45) Date of Patent: Jun. 9, 2009

(54) METHOD AND APPARATUS FOR MEASUREMENT OF CROSSFIELD CHROMATIC RESPONSE OF PROJECTION IMAGING SYSTEMS

(75) Inventors: Adlai H. Smith, Escondido, CA (US); Robert O. Hunter, Jr., Snowmass Village, CO (US); Joseph Bendik, Escondido, CA (US)

(73) Assignee: Litel Instruments, San Diego, CA (US)

( * ) Notice: Subject to any disclaimer, the term of this patent is extended or adjusted under 35 U.S.C. 154(b) by 655 days.

(21) Appl. No.: 11/280,531

(22) Filed: Nov. 14, 2005

Related U.S. Application Data

(60) Provisional application No. 60/627,688, filed on Nov. 12, 2004.

(51) Int. Cl.
*G03C 5/00* (2006.01)
*G03F 9/00* (2006.01)

(52) U.S. Cl. .......................... 430/30; 430/312; 430/328; 356/515; 356/521

(58) Field of Classification Search ................... 430/30, 430/312, 328; 356/515, 521
See application file for complete search history.

(56) References Cited

U.S. PATENT DOCUMENTS

| | | | | |
|---|---|---|---|---|
| 5,828,455 A | * | 10/1998 | Smith et al. | 356/515 |
| 5,978,085 A | * | 11/1999 | Smith et al. | 356/521 |
| 6,356,345 B1 | * | 3/2002 | McArthur et al. | 356/121 |
| 2005/0240895 A1 | * | 10/2005 | Smith et al. | 716/19 |

* cited by examiner

*Primary Examiner*—Christopher G Young

(57) ABSTRACT

A method and apparatus for measuring the chromatic response of lithographic projection imaging systems is described. An apparatus for determining the lens aberrations for a lithographic projection lens is provided. A substrate coated with a suitable recording media is provided. A series of lithographic exposures are performed using an exposure source with variable spectral settings. The exposures are measured, and the measurements are used to determine a chromatic response of the projection imaging system.

31 Claims, 18 Drawing Sheets

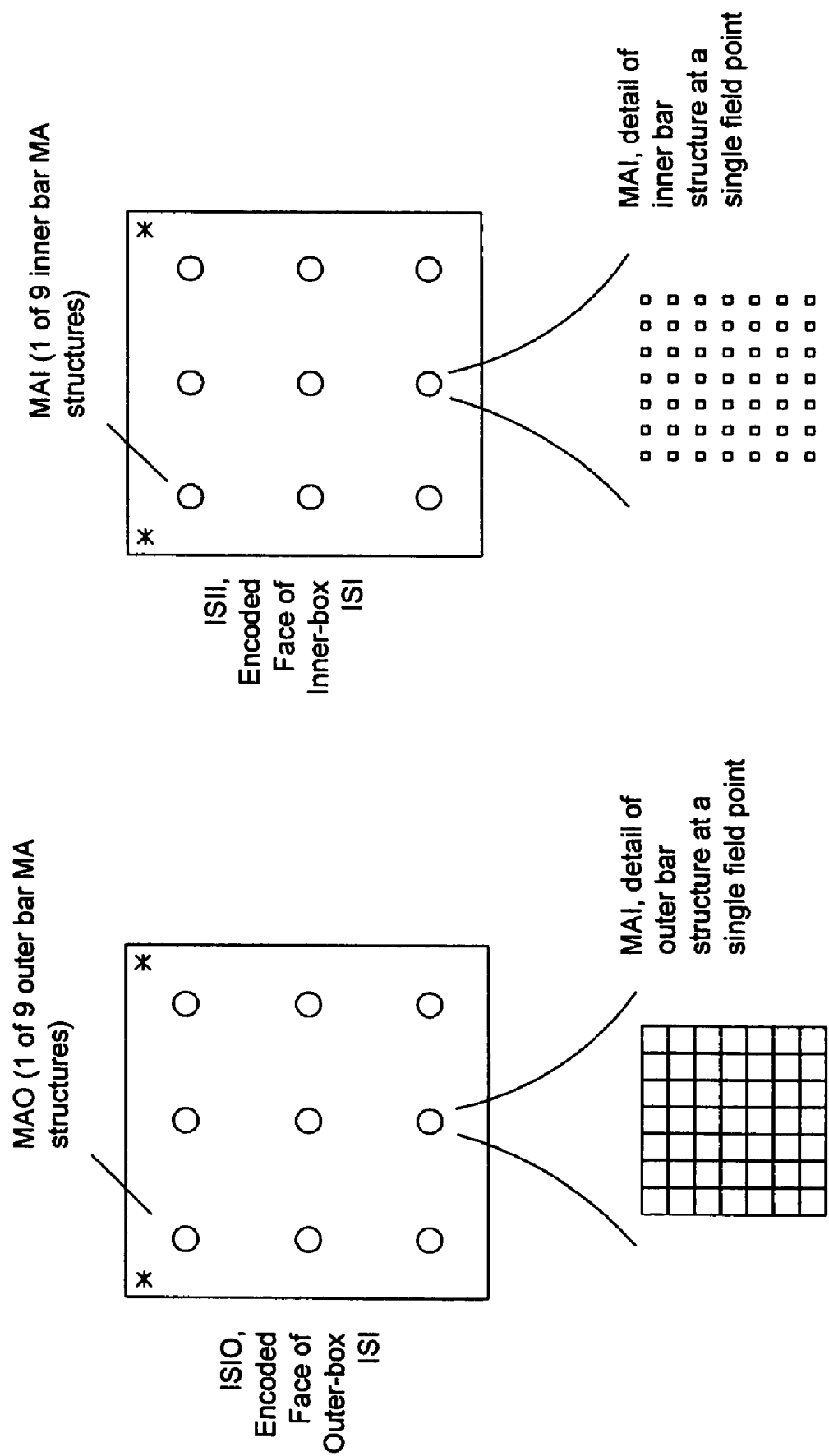

METHOD AND APPARATUS FOR MEASUREMENT OF CROSSFIELD CHROMATIC RESPONSE OF PROJECTION IMAGING SYSTEMS

REFERENCE TO RELATED APPLICATIONS

This application claims the benefit of priority to U.S. Provisional Patent Application Ser. No. 60/627,688 filed Nov. 12, 2004, entitled "Process and Method for Measurement of Crossfield Chromatic Response of Projection Imaging Systems", by Adlai Smith, Robert O. Hunter Jr., Joseph J. Bendik Jr. Priority of the filing date of the provisional application is hereby claimed, and the disclosure is hereby incorporated by reference.

BACKGROUND

1. Field of the Invention

The present invention relates generally to processes for semiconductor manufacturing and more particularly to source metrology, process emulation, process control, and methods for characterizing lithographic processes and scanning projection systems used in Very Large Scale Integration (VLSI) photolithography.

2. Description of the Related Art

As semiconductor manufacturers race to produce integrated circuits with greater functionality and higher speed (smaller pitch, low k1, etc.) in shorter periods of time (see, for example, SEMATECH, "Lithography Difficult Challenges", *Table* 56 ITRS, 2002 update, p. 63), methods for improving process yields become more difficult and represent a gating factor for profitability. A critical, difficult, and expensive semiconductor process is lithography, where process engineers and equipment manufacturers together are expected to produce high yields in the presence of fundamental (physical) limitations related to resolution, depth of focus, and overlay control. As the semiconductor industry pushes toward the fundamental limits of optical lithography, improvements in lithographic manufacturability especially those related to lithographic simulation (including Resolution Enhanced Technology (RET) design), tool or machine characterization/ correction, and methods for improving lithographic processes/yields (for example, improving depth of focus for memory devices) are necessary (see, for example, P-Yang Yan, "Method and Apparatus for Enhancing the Focus Latitude in Lithography", U.S. Pat. No. 5,303,002, Apr. 12, 1994).

The ability to model (simulate) the lithography process, especially the projection imaging system, has proved quite successful in improving manufacturing yields related to low k1 mask fabrication and lithographic processing by giving engineers the tools to optimize processes quickly and inexpensively. Electromagnetic (E&M) simulation and lithographic process modeling is probably best discussed by Neureuther in several papers (see, for example, W. Oldham et al., "A General Simulator for VLSI Lithography and Etching Processes", *Part I Application to Projection Lithography IEEE Trans. Electron Devices*, ED-26, No. 4, pp. 712-722, 1975, and M. Zuniga et al., "Reaction Diffusion in Deep-UV Positive Tone Resist Systems", *Microlithographyy Proc. of SPIE*, Vol. 2438, pp. 113-124, 1995). Today, the successful development of any low k1 lithography processes (circuit design, mask, and process development) generally requires the use of wave-front engineering techniques such as phase shift mask (PSM) and optical proximity correction (OPC) which depends heavily on computation (see, for example, W. Grobman et al., "Reticle Enhancement Technology: Implications and Challenges for Physical Design", *DAC*, Jun. 18-22, 2001, Las Vegas, Nev.).

In general, it should be noted that the performance of a lithographic simulator coupled with a stochastic engine is still rather limited, in the sense of being able to predict process performance, simply because the physical lithographic models require inputs (both statistical and absolute) that are typically unknown or estimated (see, for example, N. Jakatdar et al., "A Parameter Extraction Framework for DUV Lithography Simulation", *Metrology, Inspection, and Process Control for Microlithography XIII Proc. of SPIE*, Vol. 3677, pp. 447-456, 1999). Lithographic simulation engines such as PROLITH™ or SOLID-C™ require approximately 100 modeling parameters (many simply unknown) for the proper simulation of the lithography process including chromatic effects. The introduction of complex chemically amplified resist (CAR) has dramatically improved lithographic imaging with the added cost of parameter heavy resist models, such as post exposure bake, non Fickian diffusion, etc., (see, for example, "Reaction Diffusion in Deep-UV Positive Tone Resist Systems", supra). Advances in lithographic simulation, notably speed and complexity, have become vital as the industry depends on virtual process development and lithographic process optimization (see, for example, D. Gerold et al., "Multiple Pitch Transmission and Phase Analysis of Six Types of Strong Phase-Shifting Masks", *Optical Microlithography Proc. of SPIE*, VOL. 3677, pp. 447-456, 1999). Hereto however, the outputs and benefits of lithographic simulation (namely, process optimization) depend strongly on the accuracy of the lithographic inputs (especially, source signature, lens aberrations, and mask description) including a good understanding of tool (machine) and process variability (see, for example, "A Parameter Extraction Framework for DUV Lithography Simulation", supra and J. Cain et al., "Optimum Sampling for Characterization of Systematic Variation in Photolithography", *Optical Microlithography Proc. of SPIE*, Vol. 4689-45). In general, the more detailed knowledge one has on the root causes of lithographic process variability and machine performance metrics (source uniformity, source signature (wavelength spectrum), aberrations, mechanics, focus) the better one can simulate lithographic behavior and optimize process performance. A powerful and flexible framework that combines collected machine subsystem performance parameters with simulation is described in "Method of Emulation of Lithographic Projection Tools", A. Smith, U.S. Provisional Patent Application No. 60/564,094, dated Apr. 20, 2004.

Remarkable progress has been made on characterizing the lithographic projection imaging system through the combined use of simulation and novel metrology methods. For example, methods for the characterization of lens aberrations can be found in see, for example, A. Smith et al., "Apparatus, Method of Measurement and Method of Data Analysis for Correction of Optical System", U.S. Pat. No. 5,828,455, Oct. 27, 1998 and A. Smith et al., "Apparatus, Method of Measurement and Method of Data Analysis for Correction of Optical System", U.S. Pat. No. 5,978,085, Nov. 2, 1999. Methods for the characterization of illumination sources (including response to laser bandwidth) can be found in both see, for example, B. McArthur et al., "In-Situ Source Metrology Instrument and Method of Use", U.S. Pat. No. 6,356,345, Mar. 12, 2002, and M. Terry et al., "Behavior of Lens Aberrations as a Function of Wavelength for KrF and ArF Lithography Scanners", *Optical Microlithgraphy Proc. of SPIE*, pp. 113-124, 1995. The ability to accurately measure the performance of the projection imaging system has proved to be a valuable tool for tool acceptance, production monitoring, simulation, and advanced process control applications (see, for example, Nikon Corp., "Method of Forming and Adjusting Optical System and Exposure Apparatus, and for Determining Specification thereof and Related Computer System", "Method of Forming and Adjusting Optical System and Exposure Apparatus, and for Determining Specification thereof and Related Computer System", supra).

The International Technology Roadmap for Semiconductors (ITRS) roadmap predicts that the gate layer process for the sub-65 nm (MPU) lithography node requires controlling the lithographic process (lithography thru etch) to within 1-2 nm (3-sigma). The roadmap also predicts that DRAM manufacturers must control the contact layer process to within 6-8 nm (3-sigma). The depth of focus for the sub-65 nm node (assuming immersion lithography) is projected to be less than 0.2 um. As the semiconductor industry pushes toward the limits of optical lithography (k1 ~0.25) the industry will need to find creative manufacturing solutions, especially for improving lithographic depth of focus. Several methods for improving lithographic depth-of-focus (especially for contact hole processes) using chromatic aberrations have been proposed (see, for example, I. Lalovic, "Depth of Focus Enhancement by Wavelength Modulation", *ARCH Interface*, San Diego, Calif., 2003, pp. 9-15, and U.S. Pat. No. 5,303,002, supra)—these methods are referred to as chromatically enhanced lithography (CEL).

There is therefore a need to improve the determination of the chromatic response of a lithographic projection tool and producing methods for improving sub-wavelength lithographic process yield.

SUMMARY

Techniques for determining a chromatic response of a projection imaging system are described. In one technique, a first pattern is exposed onto a substrate with an illumination source configured at a first spectral setting. The substrate includes a recording media. A second pattern is exposed onto the substrate with the illumination source configured at a second spectral setting. The exposed patterns are then measured and a chromatic response of the projection imaging system is determined based upon the measurements. Exposing patterns at different spectral settings may be repeated a desired number of times.

The spectral settings of the illumination source can include the illumination source nominal wavelength, spectral shape, bandwidth, pulse duration, pulse number, polarization, or spatial energy distribution. The spectral settings can also include a focus matrix or an exposure matrix. In addition, the spectral settings may be adjusted so to minimize coma effects of the illumination source.

Measuring the exposed patterns can include ISI01, ISI02, SPIN, ARTEMIS, ISIS, multi-wavelength scatterometry, multi-angle scatterometry, Nomura, or FE matrix. In addition, exposing the patterns can include ILIAS, P-PMI, or PMI.

The substrate can be a semiconductor surface, a silicon wafer, a flat panel display, a reticle, a photolithographic mask, or an electronic recording media. Examples of recording media include a negative resist material, a positive resist material, an electronic CCD, a liquid crystal material, or an optically sensitive material. The projection imaging system can be used in a photolithographic stepper system, a photolithographic scanner system, a one dimensional scanner, a two dimensional scanner, an electronic beam imaging system, an extreme ultra-violet photolithographic tool, an EPL machine, or an image side immersion lens, or an x-ray imaging system.

In another embodiment, a reticle with a pattern is provided. A first reticle pattern is exposed with an illumination source with a first spectral setting onto a substrate with a recording media. Then a second reticle pattern is exposed with the illumination source configured with a second spectral setting onto the substrate, wherein the exposures comprise a focus and exposure matrix. The exposed reticle patterns are measured, wherein measuring includes critical dimension measurements of the exposed patterns. A chromatic response of the projection imaging system is determined based upon the measurements. The reticle pattern can include a line/space pattern or a contact hole pattern.

In another embodiment the chromatic response of a projection imaging system can be determined by providing a first reticle with an ISIO pattern and a second reticle with an ISII pattern. Exposing the ISIO pattern with an illumination source with a first spectral setting onto a substrate with a recording media. Then exposing the ISII pattern with the illumination source configured with a second spectral setting onto the substrate, wherein the exposed ISII pattern overlays the exposed ISIO pattern thereby forming completed alignment attributes. Measuring the exposed completed alignment attributes, and determining chromatic response of the projection imaging system based upon the measurements.

In yet another embodiment the chromatic response of a projection imaging system is determined by providing a reticle with a first set of alignment attributes and a second set of alignment attributes, wherein the first and second sets of alignment attributes are complementary. Exposing the first set of alignment attributes with an illumination source with a first spectral setting onto a substrate with a recording media. Then exposing the second set of alignment attributes with the illumination source configured with a second spectral setting onto the substrate, wherein the exposed second set of alignment attributes overlays the exposed first set of alignment attributes thereby forming completed alignment attributes. Then measuring the exposed completed alignment attributes, and determining chromatic response of the projection imaging system based upon the measurements. For example, the alignment attributes may be inner overlay targets and outer alignment attributes.

The techniques for determining chromatic response of a projection imaging system can be performed with an illumination source with adjustable spectral settings. Projection optics are used to form an image of a pattern illuminated by the illumination source. The image is exposed onto a substrate with a recording media. Multiple images of the pattern are exposed by the illumination source at different spectral settings. Measurements of the exposed patterns are used in determining chromatic response of the projection imaging system.

The chromatic response can be used in determining an optimum focus for each spectral setting using an interferometer system, such as depth of focus or iso-dense bias. The projection imaging system may include an interferometer system that can be used in determining the optimum focus. In addition, a set of spectral settings that optimize lithographic performance metrics of the lithographic machine may be determined. The spectral settings that optimize lithographic performance metrics may be determined using a lithography process simulator.

Other features and advantages of the present invention should be apparent from the following description of the preferred embodiment, which illustrates, by way of example, principles of the invention.

BRIEF DESCRIPTION OF THE DRAWINGS

FIG. 7 is a diagram illustrating an example of an outer-box encoded face (ISIO).

FIG. 8 is a diagram illustrating an example of an inner-box ISI encoded face (ISII).

DETAILED DESCRIPTION

A method and apparatus for measuring the chromatic response of lithographic projection system is described. In one embodiment, an apparatus for determining the wavefront phase error for a lithographic projection lens is provided. Then, a substrate coated with a suitable recording media is provided. Next, a series of lithographic exposures are performed using an exposure source with variable nominal wavelength or chromatic signature. Following exposure, the substrate is loaded into a conventional overlay tool and measured. The overlay measurements are then entered onto a software algorithm for across-field chromatic Zernike reconstruction. Techniques can be used to link the progress made in simulation, machine characterization, and chromatic lithography to improve the determination of the chromatic response of a lithographic projection tool and producing methods for improving sub-wavelength lithographic process yield. Applications of the embodiments described can be used to perform lithographic emulation, machine adjustment, process development, and advanced process control.

First Embodiment

Measuring Chromatic Response of Lens

Figure 1:
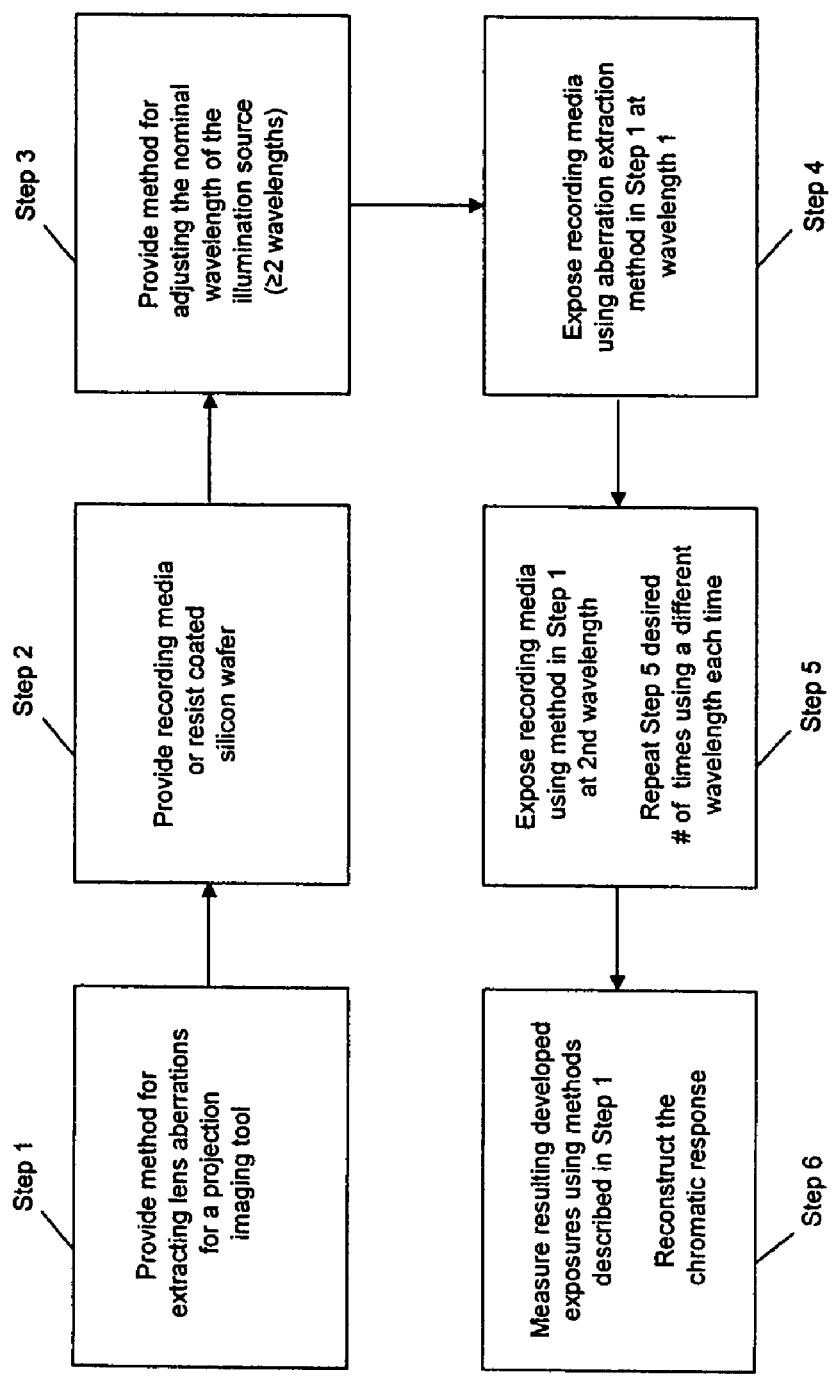
FIG. 1 is a block diagram illustrating steps of a first embodiment for determining chromatic response of a lithographic projection imaging system.

FIG. 1 is a block diagram illustrating steps of a first embodiment for determining chromatic response of a lithographic projection imaging system.

Step 1: Provide Method for Determining Lens Aberrations

Figure 2:
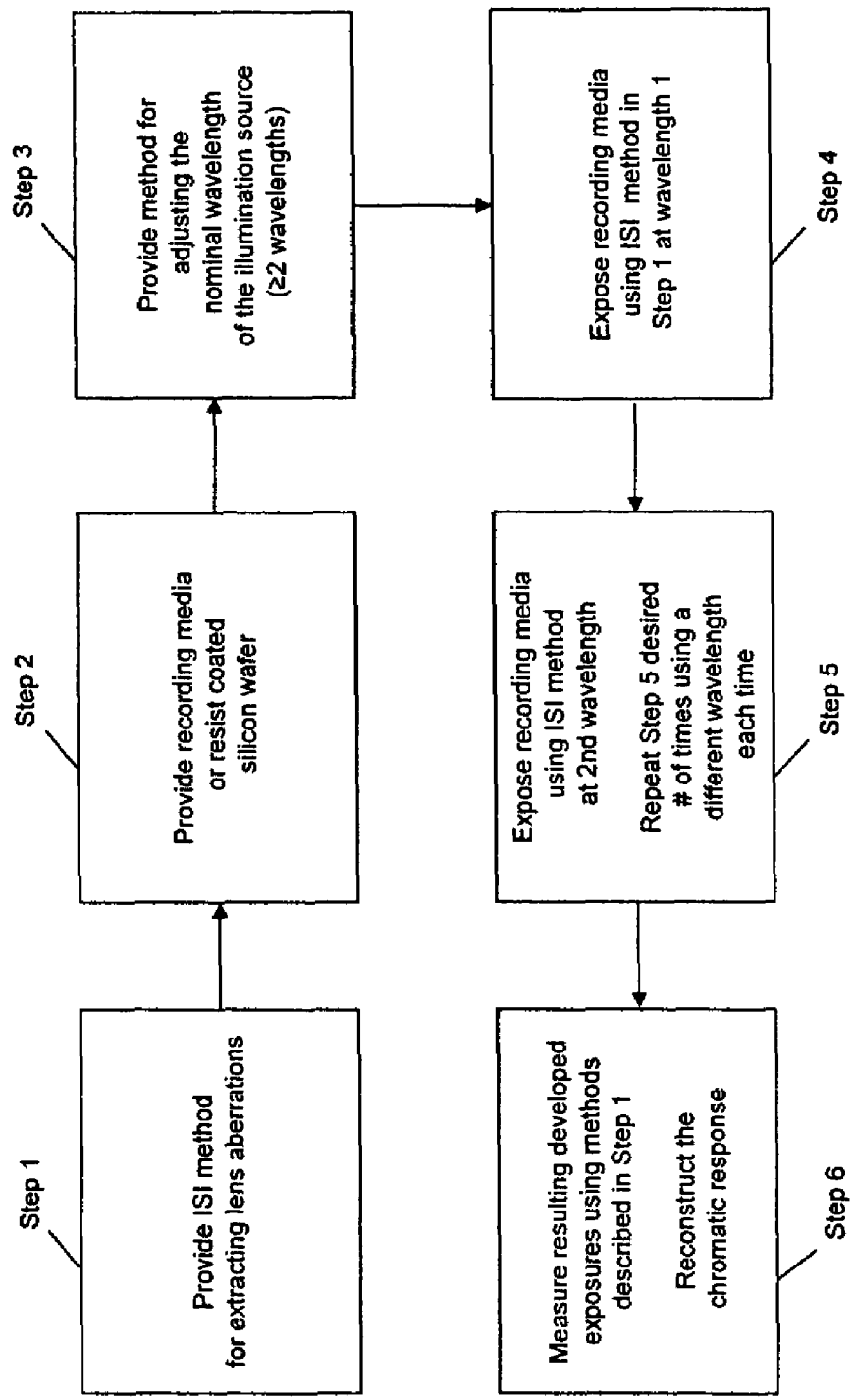
FIG. 2 is a block diagram illustrating steps of an exemplary embodiment for determining chromatic response of a lithographic projection imaging system.

A method and possibly an apparatus for determining lens aberrations for a projection imaging tool is first provided. FIG. 2 is a block diagram illustrating steps of an exemplary embodiment for determining chromatic response of a lithographic projection imaging system. As shown in FIG. 2, a method for determining lens aberrations, Φ (nx, ny) in the projection-imaging field is described in U.S. Pat. No. 5,828, 455, supra and U.S. Pat. No. 5,978,085, supra. An ISI or in-situ interferometer (reticle) is useful for it can be used to determine the chromatic response of the lithographic exposure tool at multiple field positions. By chromatic response we mean: dai/dλ=change in Zernike coefficient number per unit wavelength.

Depending on the set of aberrations we are assessing, the appropriate instrument is provided. For example, if we are mainly interested in the higher order Zernike aberrations (e.g., beyond x-tilt (a2), y-tilt (a3), and focus (a4)) the In-Situ Interferometer (ISI)™ described in U.S. Pat. No. 5,828,455, supra, and U.S. Pat. No. 5,978,085, supra, may be used. These techniques accurately measure everything beyond focus. The ISI can also measure a2, a3, and a4 but the results are typically compromised by wafer stage and transverse stage error for a2 and a3, while a4 results are typically compromised by wafer stage, z-scan synchronization and wafer flatness effects. These aforementioned effects do not compromise Zernikes a5 and above. Of course if these effects are known to be minimal, then the ISI of see, for example, U.S. Pat. No. 5,828,455, supra, and U.S. Pat. No. 5,978,085, supra, can be used to assess all aberrations.

For assessing a4 or lens field curvature, techniques described in A. Smith et al., "Apparatus and Process for the Determination of Static Lens Field Curvature", U.S. patent application Ser. No. 10/844,939, filed May 12, 2004 could be used to measure static lens field curvature while techniques described in A. Smith et al., "Apparatus and Process for Determination of Dynamic Lens Field Curvature", U.S.

patent application Ser. No. 10/833,557, filed Apr. 28, 2004, could be applied to dynamic scan field curvature. Both of these techniques produce results divorced or independent of mechanically induced (wafer or reticle stage) z-height errors and wafer flatness effects. Of course, other techniques can be used for assessing a4 or lens curvature.

For assessing a2 and a3 (lens x and y Zernike tilt or Zernike distortion) techniques described in A. Smith et al., "Method and Apparatus for Self-Referenced Dynamic Step and Scan Intra-Field Scanning Distortion", U.S. Pat. No. 6,906,303, Jun. 14, 2005, could be used to measure static lens field curvature (FC) while techniques described in A. Smith et al., "Method and Apparatus for Self-Referenced Dynamic Step and Scan Intra-Field Lens Distortion", U.S. Pat. No. 6,906,780, Jun. 14, 2005, could be applied to dynamic lens field curvature (FC). These techniques produce results independent of stage (wafer or reticle) transverse positioning errors; the final answer is the transverse distortion attributable to a2 and a3. Of course, other techniques can be used for assessing a2 or a3.

Step 2: Provide Substrate with Recording Media

Next, a wafer or substrate coated with a suitable recording media such as photoresist is provided and loaded into the lithographic projection imaging tool.

Step 3: Provide Method for Adjusting Laser Spectrum

Figure 3:
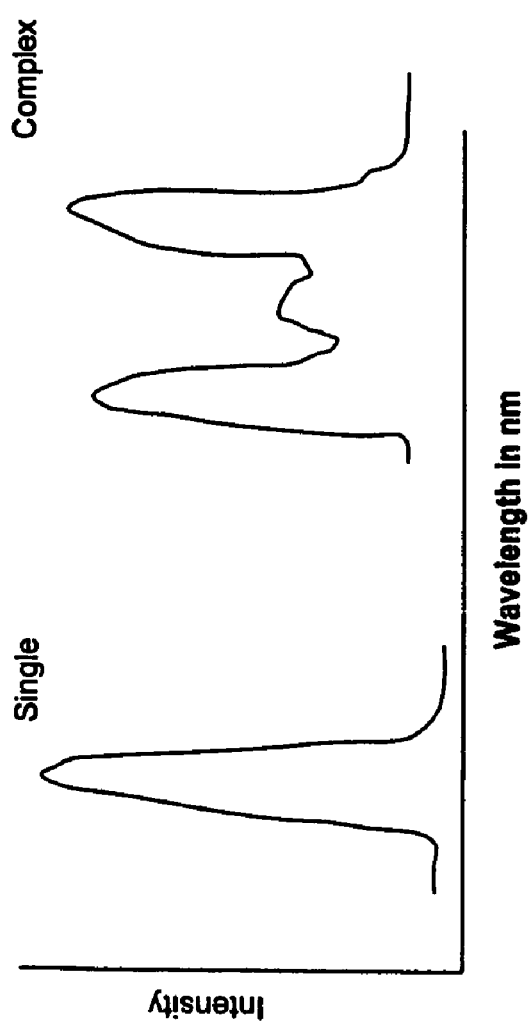
FIG. 3 is a plot illustrating profiles of a typical and complex laser pulse.

Third, a method for adjusting the nominal wavelength of the exposure source (two or more different wavelength settings) is provided. For example, for excimer lasers this could mean changing the nominal wavelength of the laser pulse—with known or unknown spectral shape. For mercury (I-line or G-line) sources a variety of discrete filters—widely available—can be used. FIG. 3 is a plot illustrating profiles of a typical and complex laser pulse. As shown in FIG. 3, the single pulse has a given peak position and bandwidth and the complex pulse has multiple peak positions and bandwidths.

Additionally, methods for adjusting source polarization, spectral shape (wavelength vs. intensity), and spectral distribution (intensity vs. spatial position) are also useful. For this work, the term spectral setting is used to represent the physical state of the light source during exposure as set by the exposure tools or controls provided for adjustment. The actual physical state of the laser source may be determined from laser source metrology tools such as those described in A. Kroyan et al., "Laser Spectral Engineering for Lithographic Process, U.S. Pat. No. 6,671,294, Dec. 30, 2003.

In summary, an illumination source capable of being discretely switched between two or more known wavelengths is provided. Examples of illumination sources include:

Excimer laser, shift 1-3 pm or some amount>>$\Delta\lambda_c$ noise (wavelength center jitter).

HG lamp

Discrete Color Filters to Block-Out High and/or Low $\lambda$

Because high pressure Hg arc lamps produce a number of high intensity spectral lines and the particular operating wavelength (e.g., I-Line or 365 nm) is chosen using wavelength sensitive interference filters, another line (e.g., g-line or 411 nm) can be selected by switching in the appropriate interference filter.

Steps 4-5: Expose Recording Media

Next, for each spectral setting of interest (>=2) the substrate is exposed using the ISI reticle at multiple field points as described in see, for example, U.S. Pat. No. 5,828,455, supra, and U.S. Pat. No. 5,978,085, supra. The number and range of the spectral settings is determined by both the expected linearity of the chromatic lens aberrations and practical methods of analysis. For example, for 248 nm and 193 nm projection lenses the experimental spectral range should cover approximately +/−10 pm. While this is not a necessity, it is rather practical since operations in the linear range reduce the number of overall experiments (2 or 3 minimal spectral settings for example). More practically, since the ISI typically requires exposing one exposure field per Zernike set (~25 mm×25 mm for steppers, 25 mm×5 mm for scanners) a large number of spectral settings will require multiple wafer substrates. Alternate embodiments of the preferred invention make use of more complex exposure designs (FE matrix for example).

In summary then, carry out the process appropriate to the chosen technologies of Step 1 at two or more discrete wavelength settings. Using the devices described in Step 1, two or more wavelengths ($\lambda 1, \lambda 2 \ldots$) are created in discrete operations and the Zernike aberration coefficients: $a_j(\bar{x}_i; \lambda_K)$ are measured.

$a_j(\bar{x}_i; \lambda_K) = j^{th}$ Zernike coefficient (j=2, 3, 4, 5 ...)

$\bar{x}i$=transverse location in projected imaging field where Zernikes are determined.

Techniques described in see, for example, U.S. Pat. No. 5,828,455, supra, U.S. Pat. No. 5,978,085, supra, and A. Smith et al., "Method and Apparatus for Self-Referenced Projection Lens Distortion Mapping", U.S. Pat. No. 6,573,986, Jun. 2, 2003, U.S. patent application Ser. Nos. 10/833,557, supra, and A. Smith et al., "Apparatus and Process for Determination of Dynamic Scan Field Curvature", U.S. patent application Ser. No. 10/833,781, filed Apr. 28, 2004, and U.S. Pat. No. 6,906,780, supra, intrinsically determine the aberrations at multiple field points.

$$aj(\bar{x}_i, \lambda) = amj(\bar{x}_i) + (\lambda - \lambda c)\frac{dam_j}{d\lambda}(\bar{x}_i)\lambda c = \lambda 1 \quad \text{(Equation 1)}$$

$$amj(\bar{x}_i) = a_j(\bar{x}_i, \lambda 1) \quad \text{(Equation 2)}$$

$$\frac{dam_j}{d\lambda}(\bar{x}_i) = \frac{1}{\lambda 2 - \lambda 1}[a_j(\bar{x}_i, \lambda 2) - a_j(\bar{x}_i, \lambda 1)] \quad \text{(Equation 3)}$$

The linear model of Equation 1 is typically all that is required, to model lens chromatic response.

When more than two wavelengths (N$\lambda$ in particular) are measured and the linear model of Equation 1 is still adequate, we would utilize least squares (see, for example, W. Press et al., "Numerical Recipes, The Art of Scientific Computing", *Cambridge University Press*, pp. 52-64, 1990) to determine amj($\bar{x}_i$) and $$\frac{dam_j}{d\lambda}(\bar{x}_i)$$

by minimizing for each i (field point) and j (Zernike coefficient) value:

$$E_{i,j} = \sum_{K=1}^{N\lambda}\left[a_j(\bar{x}_i, \lambda_K) - am_j(\bar{x}i) - (\lambda_K - \lambda_c)\frac{dam_j}{d\lambda}(\bar{x}i)\right]^2 \quad \text{(Equation 4)}$$

where $\lambda_c = (\lambda_1 + \lambda_2 \ldots + \lambda_{N\lambda})/N_\lambda$ i=1: NFP, j=Zernike coefficient.

Should a non-linear model be required, the appropriate generalization would be used. Thus for a quadratic model:

$$a_j(\bar{x}_i, \lambda) = am_j(\bar{x}_i) + (\lambda - \lambda_c)\frac{dam_j}{d\lambda}(\bar{x}_i)\left(\frac{\lambda - \lambda_c}{2}\right)^2 \frac{d^2 am_j}{d\lambda^2}(\bar{x}i)$$ (Equation 5)

we would minimize for each $i$ and $j$:

$$E_{i,j} = \sum_{K=1}^{N\lambda}\left[a_j(\bar{x}_i, \lambda_k) - am_j(\bar{x}_i) - (\lambda k - \lambda c)\frac{dam}{d\lambda}(\bar{x}_i) - \frac{(\lambda_k \lambda_c)^2}{2}\frac{d^2 am}{d\lambda^2}(\bar{x}_i)\right]^2$$ (Equation 6)

Step 6: Measure Recording Media and Determine the Chromatic Response of the Projection Tool.

Figure 4:
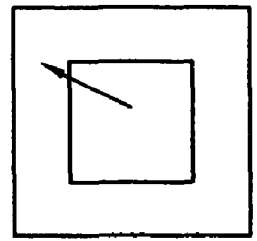
FIG. 4 is a schematic illustrating an example of a box-in-box overlay target.
Figure 5:
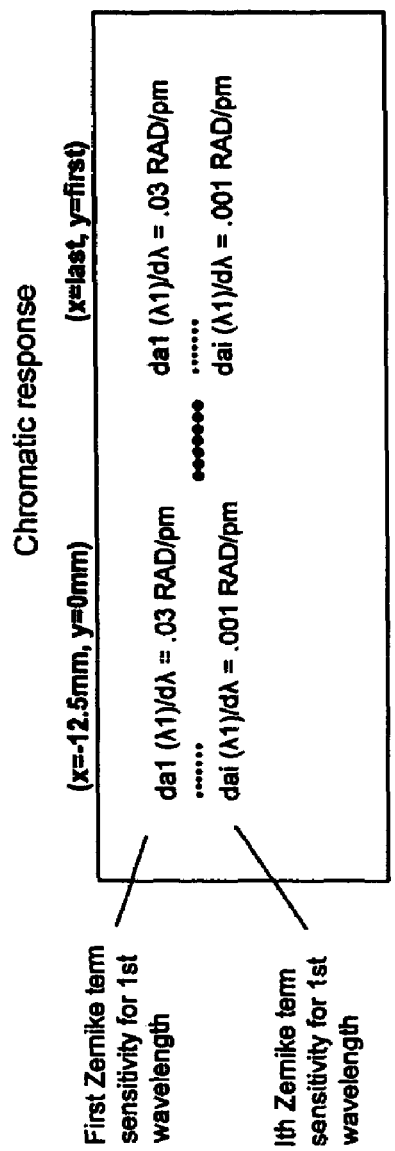
FIG. 5 illustrates typical results of Zernike coefficient sensitivity as a function of wavelength and field position RAD/pm.

Following the exposure sequence the wafer substrates may be measured on a conventional overlay tool as described in see, for example, U.S. Pat. No. 5,828,455, supra. FIG. 4 is a schematic illustrating an example of a box-in-box overlay target, the vector indicating displacement of inner box to the outer box. Next, using the methods described in see, for example, U.S. Pat. No. 5,828,455, supra, a Zernike map is constructed for each field point and for each spectral setting. FIG. 5 illustrates typical results of Zernike coefficient sensitivity as a function of wavelength and field position RAD/pm. The Zernike expansions for each spectral setting completely characterize the chromatic response of the lithographic projection tool. Alternate embodiments of the preferred invention make use of more exact definitions of the physical state of the laser source or spectral setting (for example, bandwidth, spectrum shape (intensity), and polarization).

Variation of the First Embodiment

Figure 6:
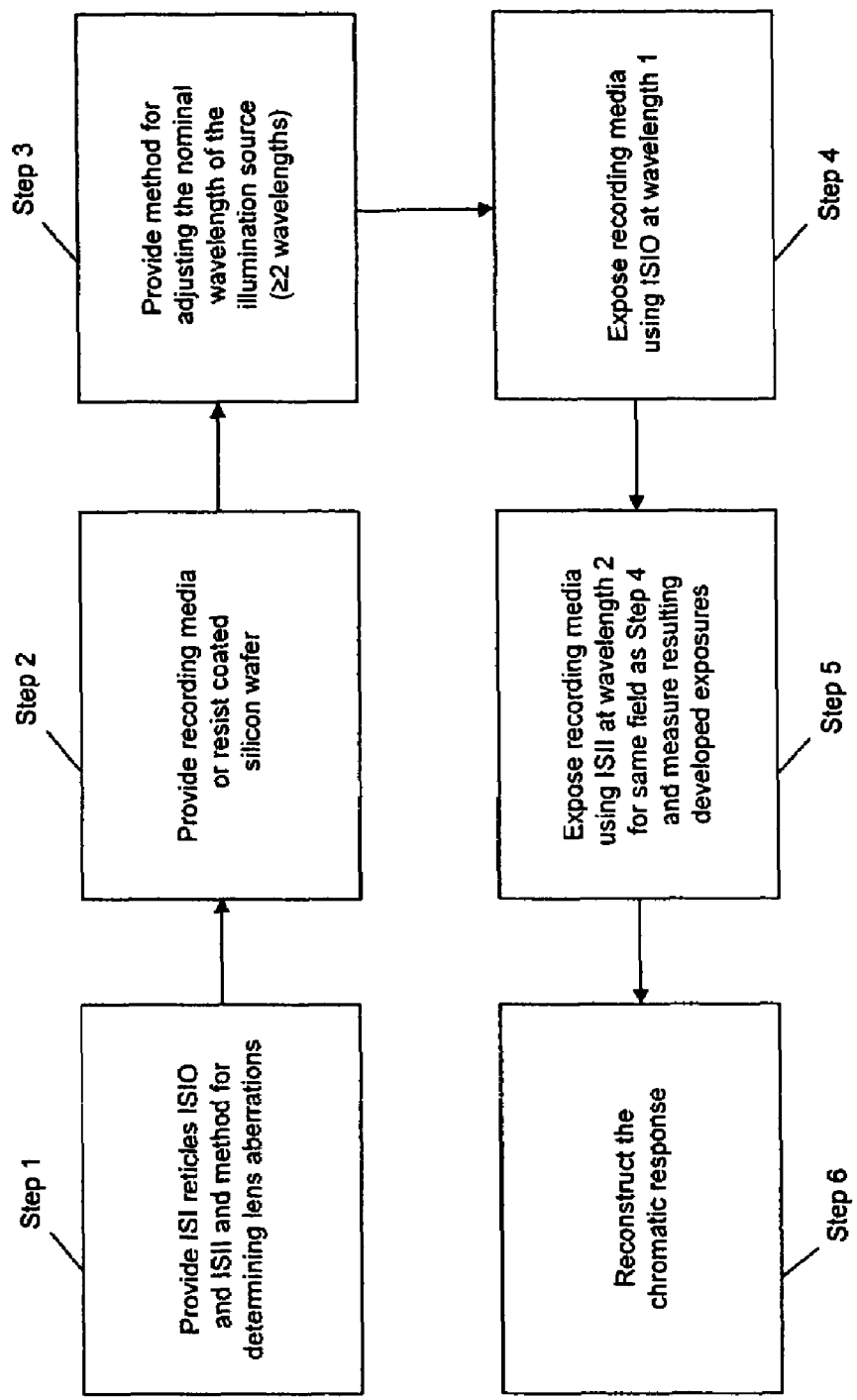
FIG. 6 is a block diagram illustrating steps for another embodiment for determining chromatic response of a lithographic projection imaging system.

FIG. 6 is a block diagram illustrating steps for another embodiment for determining chromatic response of a lithographic projection imaging system. The first embodiment asks the user to determine the aberrations at each discretely measured wavelength. So, if two wavelength settings are chosen, an ISI (see, for example, U.S. Pat. No. 5,828,455, supra, and U.S. Pat. No. 5,978,085, supra) two sets of Zernike aberrations (a5 ($\lambda$1), a6 ($\lambda$1), . . . and, a5 ($\lambda$2), a6 ($\lambda$2), . . . ) would be determined. If the user already knows his aberrations (from historical use of the ISI) and the linear model (Equation 1) is applicable, the following technique directly determines the term;

$$\frac{dam}{d\lambda}(\bar{x}_i).$$

Step 1: Provide Inner and Outer Box Encoded Face Interferometers

Referring to FIGS. 7 and 8, an ISI as described in see, for example, U.S. Pat. No. 5,828,455, supra, and U.S. Pat. No. 5,978,085, supra, is provided. FIG. 5 is a diagram illustrating an example of an outer-box encoded face (ISIO). FIG. 5 shows an ISI, ISIO, of see, for example, U.S. Pat. No. 5,828, 455, supra, and U.S. Pat. No. 5,978,085, supra, wherein the aberration carrying structure on the encoded (chrome) face consists of outer bar MA structures. FIG. 8 is a diagram illustrating an example of an inner-box ISI encoded face (ISII). FIG. 8 shows another ISI, ISII, whose encoded face aberration carry structures (MA) consist of inner bar, MAI, features. These two sets of structures could be disposed on the same ISI in different rows if only dynamic aberrations are required.

Step 2: Provide Substrate with Recording Media

Next, a wafer or substrate coated with a suitable recording media such as photoresist is provided and loaded into the lithographic projection imaging tool.

Step 3: Provide Illumination Source

Same as the main embodiment except only two discrete wavelength settings ($\lambda$1 and $\lambda$2) are required.

Steps 4-5: Carry Out Aberration Measurements

Figure 9:
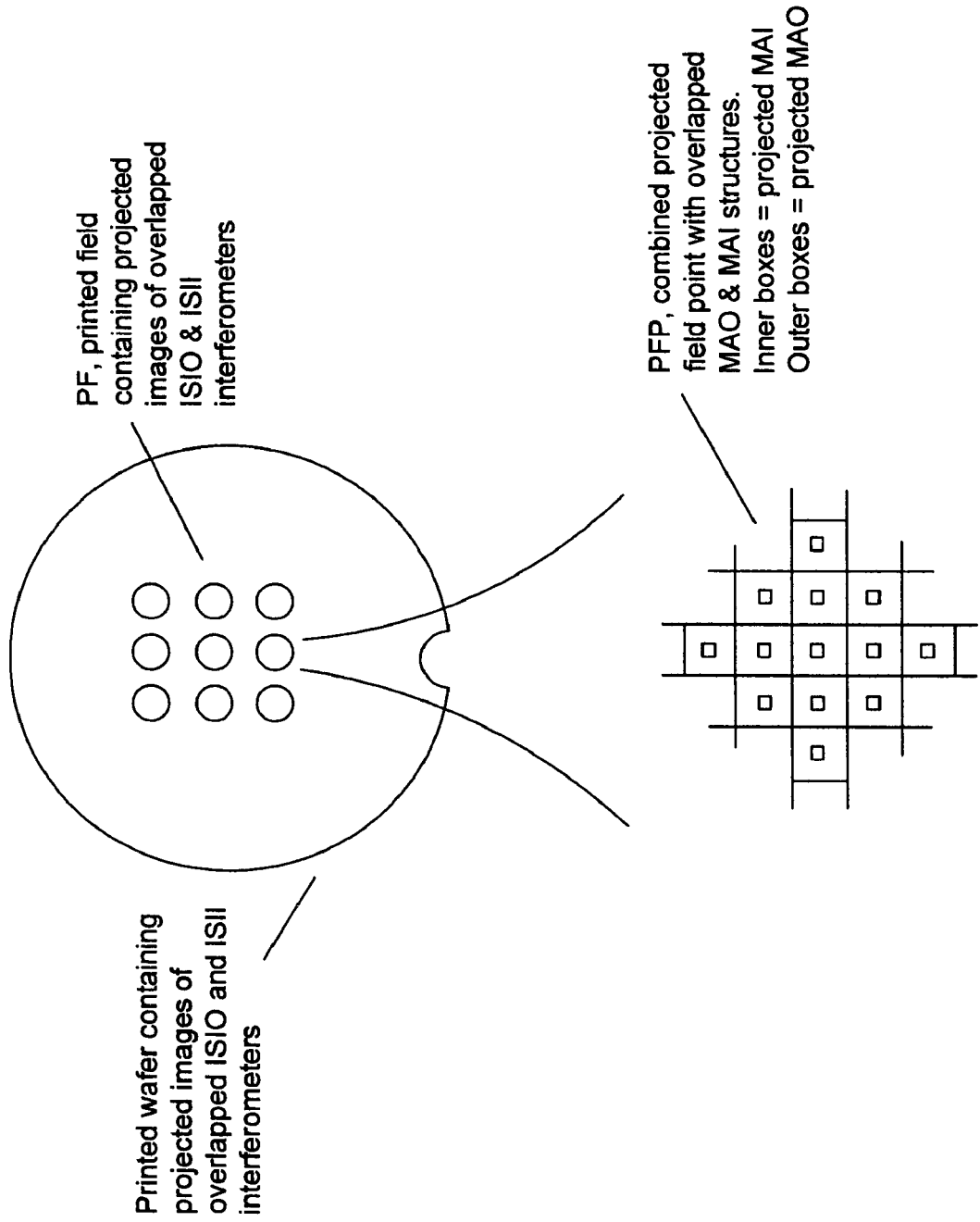
FIG. 9 is a diagram illustrating the resulting wafer, W, printed field, PF, and detail of projected field point, PFP

At this point, a wafer is provided, the projection imaging system is set to wavelength setting $\lambda$1, and outer bar interferometer ISIO is projected onto a single field of wafer, W. Next, the projection imaging system is set to wavelength setting $\lambda$2, inner bar interferometer ISII is provided and projected onto the same field. FIG. 9 is a diagram illustrating the resulting wafer, W, printed field, PF, and detail of projected field point, PFP. As explained in see, for example, U.S. Pat. No. 5,828, 455, supra, and U.S. Pat. No. 5,978,085, supra, the projected MA structures are truncated by the circular exit pupil of the projection imaging system. Overlay measurements as described in see, for example, U.S. Pat. No. 5,828,455, supra, and U.S. Pat. No. 5,978,085, supra, are then carried out at each printed field point, PFP. These are:

$$\overline{BB}(\bar{x}_i, m=1:N)$$ (Equation 7)

Step 6: Reconstruct the Chromatic Lens Response

For sufficiently large wavelength shifts (vide infra) a good approximation to the linear term is:

$$\frac{dam}{d\lambda}(\bar{x}_i) = \frac{1}{\lambda 2 - \lambda 1} aR(\bar{x}i)$$ (Equation 8)

where:

$aR(\bar{x}_i)$=reconstructed Zernike coefficients resulting directly from the use of the overlay measurements (Equation 7) in the standard or 'as provided' interferometer reconstruction software.

The more general and accurate procedure is as follows. We look at a single field point and drop the argument ($\bar{x}_i$). So, at a particular field point $$\overline{BB}(m) = d\overline{XI}(m) - d\overline{X}O(m)$$ (Equation 9)

where;

$$d\overline{X}I(m) = \sum_j \overline{CI}(m, j)\left[am_j + (\lambda_2 - \lambda_0)\frac{dam_j}{d\lambda}\right]$$ (Equation 10)

$$d\overline{X}O(m) = \sum_j \overline{CO}(m, j)\left[am_j + (\lambda_1 - \lambda_0)\frac{dam_j}{d\lambda}\right]$$ (Equation 11)

$d\overline{X}I$ and $d\overline{X}O$ are the inner and outer box displacements respectively and $\overline{CI}$, $\overline{CO}$ the inner and outer box tool configuration coefficients. These depend on the constructional and layout geometry of the interferometer and are calculated as described in see, for example, U.S. Pat. No. 5,828,455, supra, and U.S. Pat. No. 5,978,085, supra. Relating the measured bar-in-bar data to them we get:

$$\overline{BB}(m) = \sum_j (\overline{CO}(m, j) - \overline{CI}(m, j))am_j +$$ (Equation 12)

$$\overline{CO}(m, j)(\lambda 1 - \lambda o)\overline{CI}(m, j)(\lambda 2 - \lambda o)\frac{dam_j}{d\lambda}$$

To the extent $\overline{CO} = \overline{CI}$ Equation 12 becomes:

$$\overline{BB}(m) = \sum_j \overline{CO}(m, j)\left((\lambda 1 - \lambda 2)\frac{dam_j}{d\lambda}\right)$$ (Equation 13)

and the prescription that leads to Equation 8 is recovered. In Equation 12, $\lambda o$ is the standard machine operating wavelength setting; the setting where historical aberration data has been taken. Then we can identify $am_j$ with the most recent historical data (e.g., $am_j$ is known in advance to us) and rewrite Equation 12 as:

$$\overline{BB}(m) = \sum_j (\overline{CO}(m, j) - \overline{CI}(m, j))am_j =$$ (Equation 14)

$$\sum_j [\overline{CO}(m, j)(\lambda 1 - \lambda 0) - \overline{CI}(m, j)(\lambda 2 - \lambda 0)]\frac{dam_j}{d\lambda}$$

The left hand side of Equation 14 is known to us as $\overline{CO}(m,j)$, $\overline{CI}(m,j)$, $(\lambda 1 - \lambda 0)$, $(\lambda 2 - \lambda 0)$; only $$\frac{dam_j}{d\lambda}$$

is unknown. Equation 14 can be solved via singular value decomposition as described in see, for example, "Numerical Recipes, The Art of Scientific Computing", supra or with a view towards this specific class of application in see for example, U.S. Pat. No. 5,828,455, supra, and U.S. Pat. No. 5,978,085, supra. The latter reference describes in particular how to remove the stage related error terms. The final result of this invention is the appropriate Zernike subset (e.g., usually $$\frac{da2}{d\lambda}$$

and up) of FIG. 5.

Note that because the PFP (FIG. 9) is at a single wafer site, the cross-field wafer flatness effects are minimized and only wafer and reticle stage mechanical repeatability affect $$\frac{da4}{d\lambda}.$$

Put differently, and taking mechanical repeatabilities into consideration, we can determine the spatial dependence of $$\frac{da4}{d\lambda}(\overline{x}_i)$$

(that is the cross-field dependence or $(\overline{x}_i)$ dependence) to within a term of the form:

$$\frac{\Delta da4}{d\lambda}(x, y) = a + bx + cy$$ (Equation 15)

in static fields while in dynamically scanned fields to within a term of the form $$\frac{\Delta da4}{d\lambda}(x) = a + bx$$ (Equation 16)

The terms represented by Equations 15 and 16 are unknown if we have no knowledge or do not apply any prior knowledge of stage mechanical repeatability in the Z-direction. However, if we know that the static stage repeatability influence on $$\frac{da4}{d\lambda}(x, y)$$

is $$\frac{da4}{d\lambda}(s; x, y) = \text{stage contribution to}$$ (Equation 17)

$$\frac{da4}{d\lambda}\text{measurement}$$

$$= Z_a * \sigma_a + Z_b * \sigma_b * X + Z_c * \sigma_c * Y$$

where $\sigma_a$, $\sigma_b$, $\sigma_c$=standard deviation in stage repeatability (known)

$Z_a$, $Z_b$, $Z_c$=random numbers chosen from zero mean unit variance probability distribution (possibly unknown). Then, if we have the measured chromatic response:

$$\frac{da4}{d\lambda}(x,y) = a' + b'x + c'y \quad \text{(Equation 18)}$$

We can identify the otherwise unknown terms with a, b, c as:

a=a' b=b' c=c' (Equation 19)

with R-squared values $R_a^2 = 1 - \sigma_a^2/(a')^2$ $R_b^2 = 1 - \sigma_b^2/(b')^2$ $R_c^2 = 1 - \sigma_c^2/(c')^2$ (Equation 20)

Therefore, provided our wavelength shift is large enough that we get reasonable (>0.9) R-squared values in Equation 20 we can effectively reconstruct all spatial modes of $$\frac{da4}{d\lambda}(x,y).$$

Similar considerations apply to dynamic scan $$\frac{da4}{d\lambda}$$

with the same conclusion; provided the wavelength shift is large enough ($R^2>0.9$ in equivalent of Equation 20), we can effectively determine all spatial modes of $$\frac{da4}{d\lambda}.$$

The transverse components $$\frac{da2}{d\lambda} \text{ and } \frac{da3}{d\lambda}$$

are also exactly determined by Equations 14 or 8 when there are no transverse stage errors. Again, consideration of the relevant spatial mode structure tells us that in the case of a static projected field, the portion affected by transverse stage motion is a term of the form:

$$\left(\frac{\Delta da2}{d\lambda}, \frac{\Delta da3}{d\lambda}\right)(x,y) = (a - c*y, b + c*x) \quad \text{(Equation 21)}$$

while for dynamically scanned fields:

$$\left(\frac{\Delta da2}{d\lambda}, \frac{\Delta da3}{d\lambda}\right)(x) = (a, b + c*x) \quad \text{(Equation 22)}$$

And again, provided the wavelength is sufficiently large that the error due to stage non-repeatability can be neglected ($R^2>0.9$ in analog of Equation 20) we can effectively determine all spatial modes of $$\frac{da2}{d\lambda} \text{ and } \frac{da3}{d\lambda}.$$

Second Variation of the First Embodiment

Figure 10:
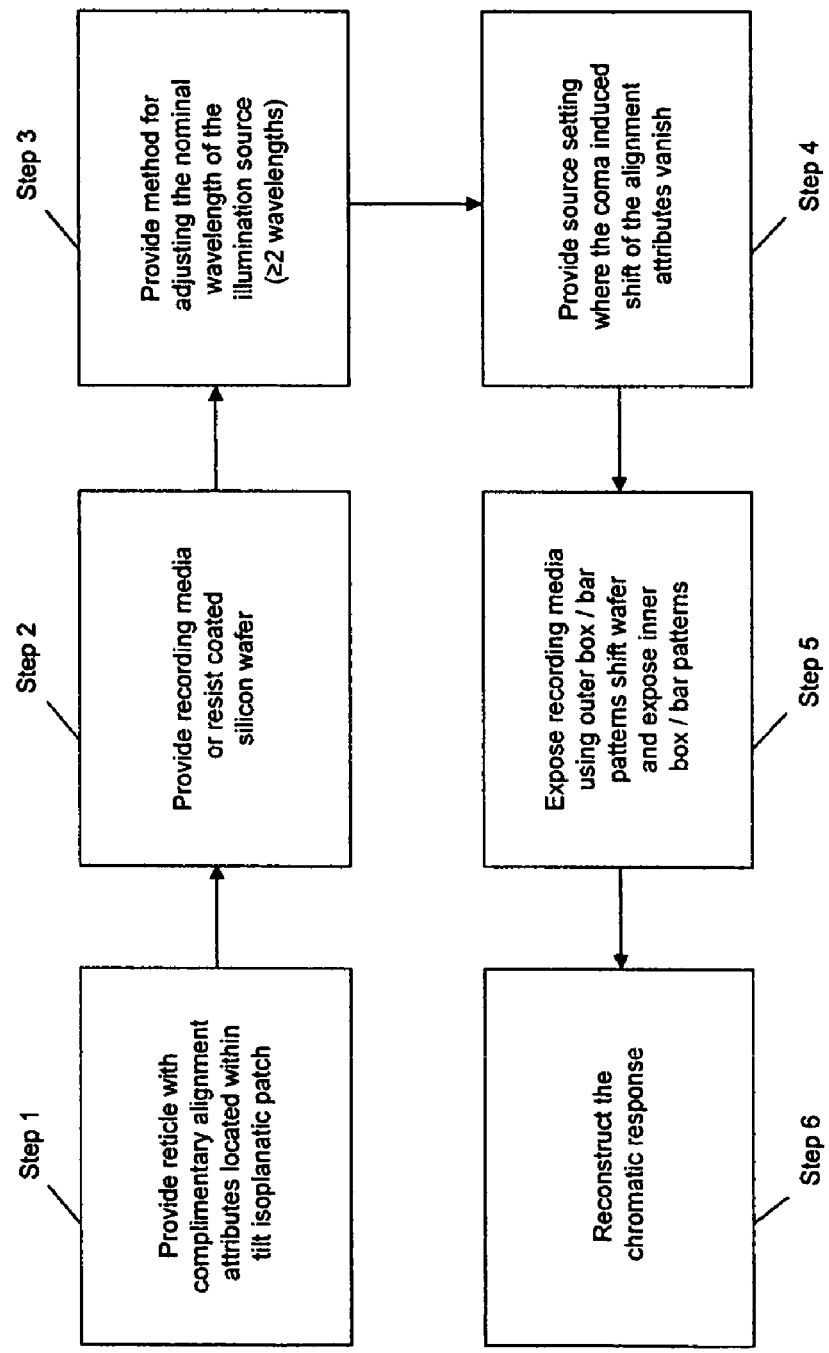
FIG. 10 is a block diagram illustrating steps of an embodiment for determining chromatic response of a lithographic projection imaging system.

FIG. 10 is a block diagram illustrating steps of an embodiment for determining chromatic response of a lithographic projection imaging system. FIG. 10 illustrates a technique for determining the linear chromatic variation of x and y tilt, $$\frac{da2}{d\lambda} \text{ and } \frac{da3}{d\lambda}.$$

Step 1: Provide Reticle

Figure 11:
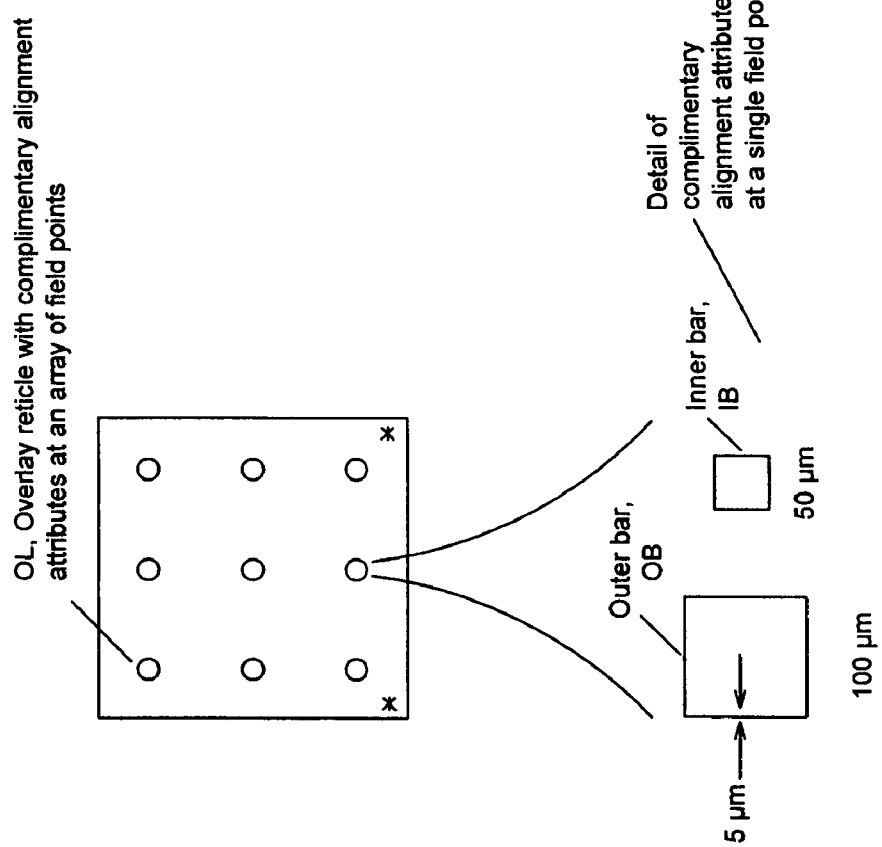
FIG. 11 is a diagram illustrating a reticle consisting of a 3×3 array of inner/outer bar patterns.

First box in FIG. 10. Examples of complementary alignment attributes are shown in see, for example, U.S. Pat. No. 6,573,986, supra, and U.S. Pat. No. 6,906,780, supra. The tilt isoplanatic patch is typically ~1 mm at the wafer. This requirement is typically met with standard overlay target pairs. FIG. 11 is a diagram illustrating a reticle consisting of a 3×3 array of inner/outer bar patterns. The overlay reticle of see, for example, U.S. Pat. No. 6,573,986, supra, could be used.

Step 2: Provide Substrate with Recording Media

Next, a wafer or substrate coated with a suitable recording media such as photoresist is provided and loaded into the lithographic projection imaging tool.

Step 3: Multi-Wavelength Setting

Third box in FIG. 10. Same requirements as in the first embodiment.

Step 4: Provide Illumination Source Settings

At this point, the method of see, for example, A. Smith et al., "Process for Determination of Optimized Exposure Conditions for Transverse Distortion Mapping", U.S. patent application Ser. No. 10/800,110, filed Mar. 12, 2004, could be used to calculate the illuminator settings (e.g., $\sigma$ or $\sigma_i/\sigma_o$) that correspond to zero shift of the alignment attributes (5 μm of space at reticle of FIG. 9) due to low order coma. For conventional illumination, that would be the $\sigma$ setting where $$\frac{dx}{da8} = \frac{dy}{da9} = 0 \quad \text{(Equation 23)}$$

when calculated for the 5 μm space of the alignment attributes of FIG. 11. More generally, for grating type alignment structures, we would find $\sigma$ value where Equation 23 holds. We could also calculate the appropriate parameters for zero-coma shift for annular or quadrupole illumination. Having carried out these calculations that correspond to the zero-coma condition, we know what machine (stepper or scanner) settings to apply to the illuminator.

Step 5: Expose and Measure

Figure 12:
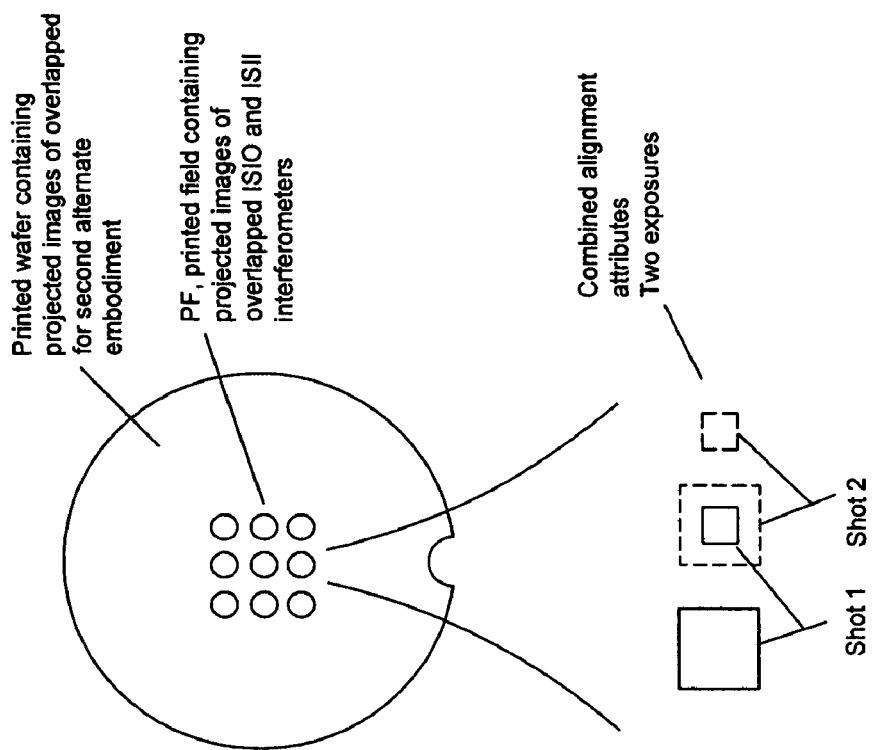
FIG. 12 is a diagram illustrating a printed wafer and further detail of a single projected field point.

Fifth box (FIG. 8) and single printed field on wafer (FIG. 12); two exposures. FIG. 12 is a diagram illustrating a printed wafer and further detail of a single projected field point. First exposure at $\lambda 1$ wavelength; for the second exposure, shift wafer in the x direction by $-s/m$ (s=complementary alignment attribute separation, m=reduction magnification ration) and expose at wavelength $\lambda 2$. In both exposures, the $\sigma$ value or other source machine setting corresponds to the zero-coma condition determined in the previous step. In FIG. 12, the lower section shows detail of the completed alignment attribute; measure to get bar-in-bar or shift data $\overline{BB}(i=1:NFP)$.

Step 6: Reconstruction

The bar in bar data is expressible in terms of a2 and a8 (BBX) as:

$$BBX = (\lambda 1 - \lambda 2)\left[\frac{da2}{d\lambda}\frac{dx}{da_2} + \frac{da8}{d\lambda}\frac{dx}{da_8}\right] \quad \text{(Equation 24)}$$

$\frac{dx}{da_2}$ and $\frac{dx}{da_8}$ are properties of the alignment attributes; they depend on the illumination and attribute geometry. Since the zero-coma condition was used in this exposure:

$$\frac{dx}{da_8} = 0$$

and we have:

$$\left(\frac{da2}{d\lambda}, \frac{da3}{d\lambda}\right) = \left(\frac{1}{\lambda 1 - \lambda 2}\right)\left(BBX\bigg/\frac{dx}{da_2}, BBY\bigg/\frac{dy}{da_3}\right) \quad \text{(Equation 25)}$$

Again, there will be spatial modes that are affected by stage transverse errors but again, with sufficiently large wavelength shifts, they can be ignored.

Accuracy and signal to noise: a rather subtle point in the description of the preferred invention needs explanation. Since a typical laser pulse has finite bandwidth (typically defined at half the maximum intensity) the Zernikes extracted using the ISI are subtlety convoluted with bandwidth effects—creating some signal to noise. For example, the Zernike set derived from the ISI tool represents only the average chromatic response for a given spectral setting. This effect though is very small (on order of a 0.5 pico meter or less) and can be averaged out by sampling over a large enough spectral range and keeping the spectral settings in the linear response region. Then once the response is known over the large spectral range the effects of the laser bandwidth can be considered and applied point by point across the exposure field—effectively creating the complete chromatic response for a lithographic projection tool.

Applications of the Embodiments

Figure 13:
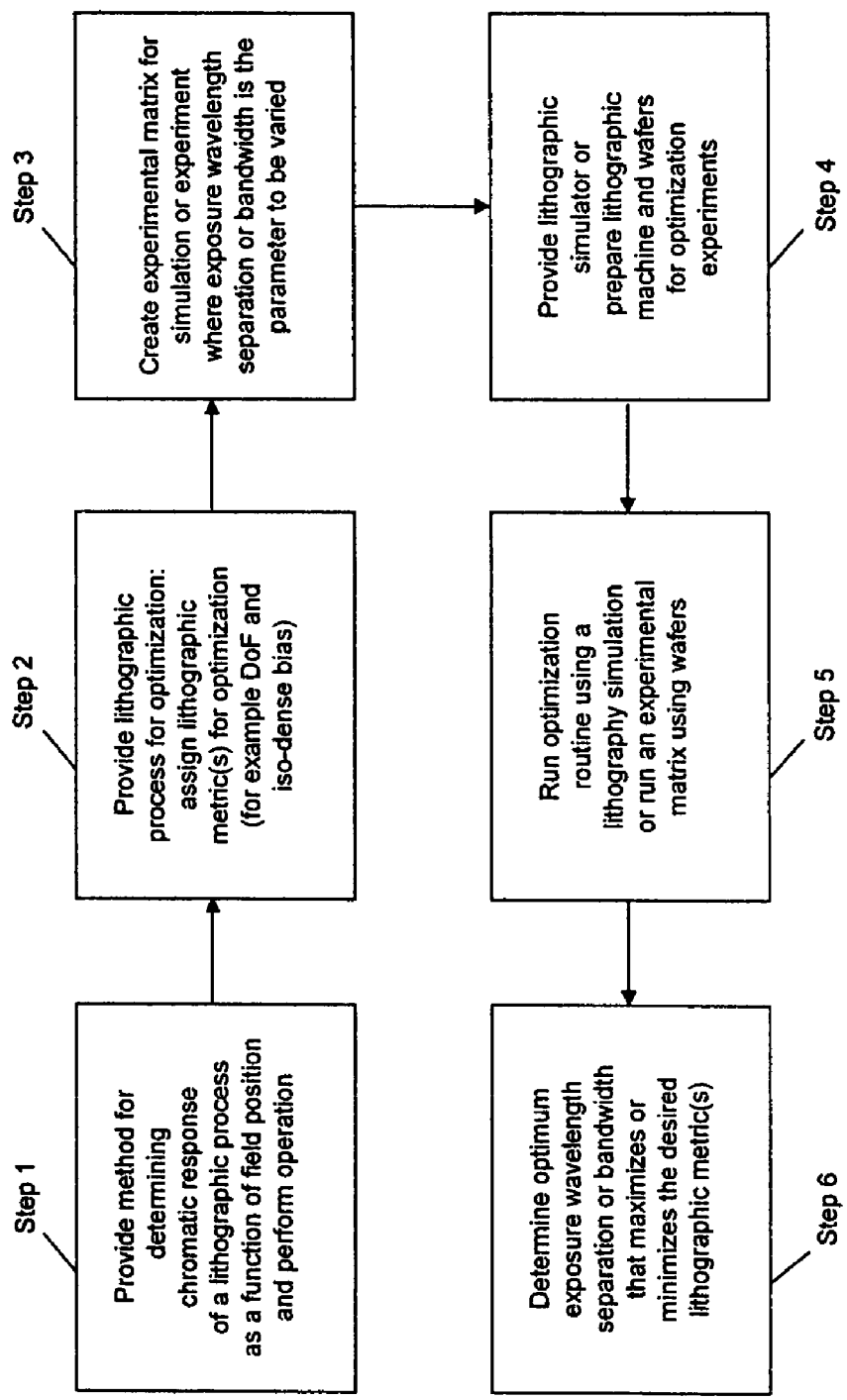
FIG. 13 is a block diagram illustrating steps of an embodiment for optimizing a lithographic process using multiple wavelengths or bandwidth.

FIG. 13 is a block diagram illustrating steps for optimizing a lithographic process using multiple wavelengths or bandwidth. FIG. 13 is a block diagram illustrating steps of an embodiment for optimizing a lithographic process using multiple wavelengths or bandwidth. Using the techniques shown in FIG. 13, improved depth of focus and process optimization can be achieved.

Knowing the complete chromatic response of photolithographic projection imaging tool allows for improved depth of focus and process optimization for lithographic processes. For example, the methods described in see, for example, U.S. Pat. No. 5,303,002, supra, and U.S. Pat. No. 6,671,294, supra, describe using chromatic adjustments to improve the lithographic depth of focus by exposing a resist coated silicon wafer at the contact layer using several different wavelengths of laser light (using several different methods—such as double exposure or as described in see, for example, U.S. Pat. No. 6,671,294, supra). Because each exposure wavelength has its own unique best focus position one effectively performs a FLEX process (see, for example, "Depth of Focus Enhancement by Wavelength Modulation", supra, P. Rai-Choudhury, "Handbook of Microlithography and Microfabrication", *Proc. of SPIE Press IEEE*, pp. 67-68, 1997, and P. Rai-Choudhury, *Handbook of Microlithography and Micromachining and Microfabrication*, Vol. 1, p. 634, 1997) and improves the overall (process) depth of focus—since exposing at two or more wavelengths distributes the image throughout the film thickness. Typically then for chromatic lithography, given any lithographic process one runs optimization routines (using experiments or lithographic simulation (see, for example, "A Parameter Extraction Framework for DUV Lithography Simulation", supra) to determine the optimum set (pair) of wavelengths to expose the reticle pattern and improve the depth of focus. In general, since aberrations are a function of wavelength it is important to consider the complete lithographic response to wavelength as opposed to looking at focus only (as described in see, for example, "Depth of Focus Enhancement by Wavelength Modulation", supra). In general, when one only considers focus changes with wavelength (to first order, the a4 Zernike coefficient) one typically finds that two exposures (at two slightly different wavelengths) are enough to improve lithographic depth of focus (for contact holes or dense lines for example). As reported in see, for example, "Depth of Focus Enhancement by Wavelength Modulation", supra, typical optimal wavelength separations are on order of a few pm for 248 nm nominal lithography and a bit less (~1 pm) for 193 nm lithography (from standard chromatic lens data). Since the method for the preferred invention determines the actual chromatic response as a function of position in the exposure field (for all Zernike coefficients, not just focus) one can run an optimization routine (see, for example, A. Ison et al., "Robust Fault Detection and Fault Classification of Semiconductor Manufacturing Equipment", 1997) and determine a best set (pair) of wavelengths that takes into consideration the chromatic response across the entire exposure field—we expect differences when considering the entire chromatic response since each Zernike term impacts lithographic imaging (even or odd orders). For example, for depth of focus improvement, one might determine the optimum set (pair) of wavelengths (using say, lithographic simulation and the known field/wavelength dependent Zernikes) for each position in the field and derive the optimum wavelength and wavelength separation by taking a field average (or, if possible through advanced laser or optical design distribute the light at different focus positions across the field and then perform multiple exposures or some other method). This process is described in FIG. 13.

Additionally, since the complete chromatic response of the lens is known, one can also run lithographic simulations or emulations to optimize the lithographic process for the entire reticle containing both isolated and dense lithographic features (process optimization coupled to depth of focus improvement—where process optimization generally refers to improving the process window—(see, for example, *Handbook of Microlithography and Micromachining and Microfabrication*, supra). Here one uses simulation and optimization strategies to determine the optimum pair of exposure wavelengths (typically separated slightly from nominal by a few pico-meters) that yields the best depth of focus while at the same time trying to minimize say iso-dense bias. As described in the preferred embodiment this also might involve running experiments or a focus-exposure matrix coupled to a wavelength matrix. In either case (simulation or experiment), one can optimize and determine the optimum set of wavelengths and their separation for the entire lithographic process knowing the complete chromatic response to the photolithographic exposure tool. FIG. 13 details the process for these additional applications.

Figure 14:
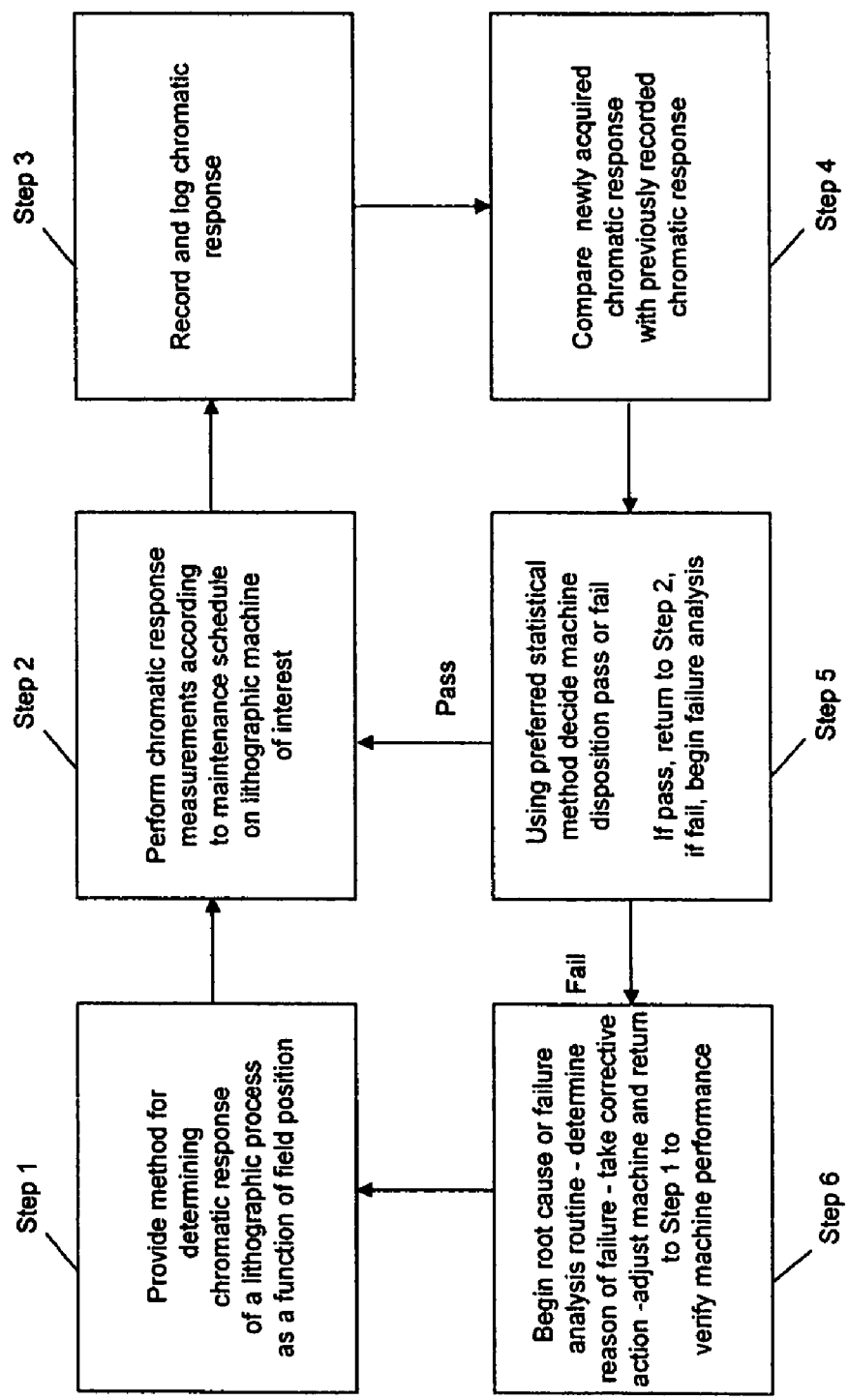
FIG. 14 is a block diagram illustrating steps of an embodiment for machine correction.

FIG. 14 is a block diagram illustrating steps of an embodiment for machine correction based upon chromatic response. Given a base-line chromatic response study of the lithographic exposure tool, one can keep track of the wavelength/field/Zernike data and track machine changes over time. For example, sampling the photolithographic tool on a weekly basis and determining the chromatic response (as a function of wavelength and field position) allows the lithographic engineer to simulate or model the performance of the lithographic system before product is run. If for example one finds drifts in lithographic performance (reduced process window or smaller depth of focus for example—as determined by simulation) over time the machine could be serviced or investigated. FIG. 14 is a block diagram illustrating steps of an embodiment for machine correction. For example, if the lens has become clouded with photoresist or the lens elements have changed we expect differences in chromatic response and therefore differences in lithographic performance. Once simulations identify potential problems experiments can be used to isolate the root cause. Standard statistical methods are useful here (see, for example, "Optimum Sampling for Characterization of Systematic Variation in Photolithography", supra). FIG. 14 shows the process flow for this particular application.

Alternate Embodiments

Figure 15:
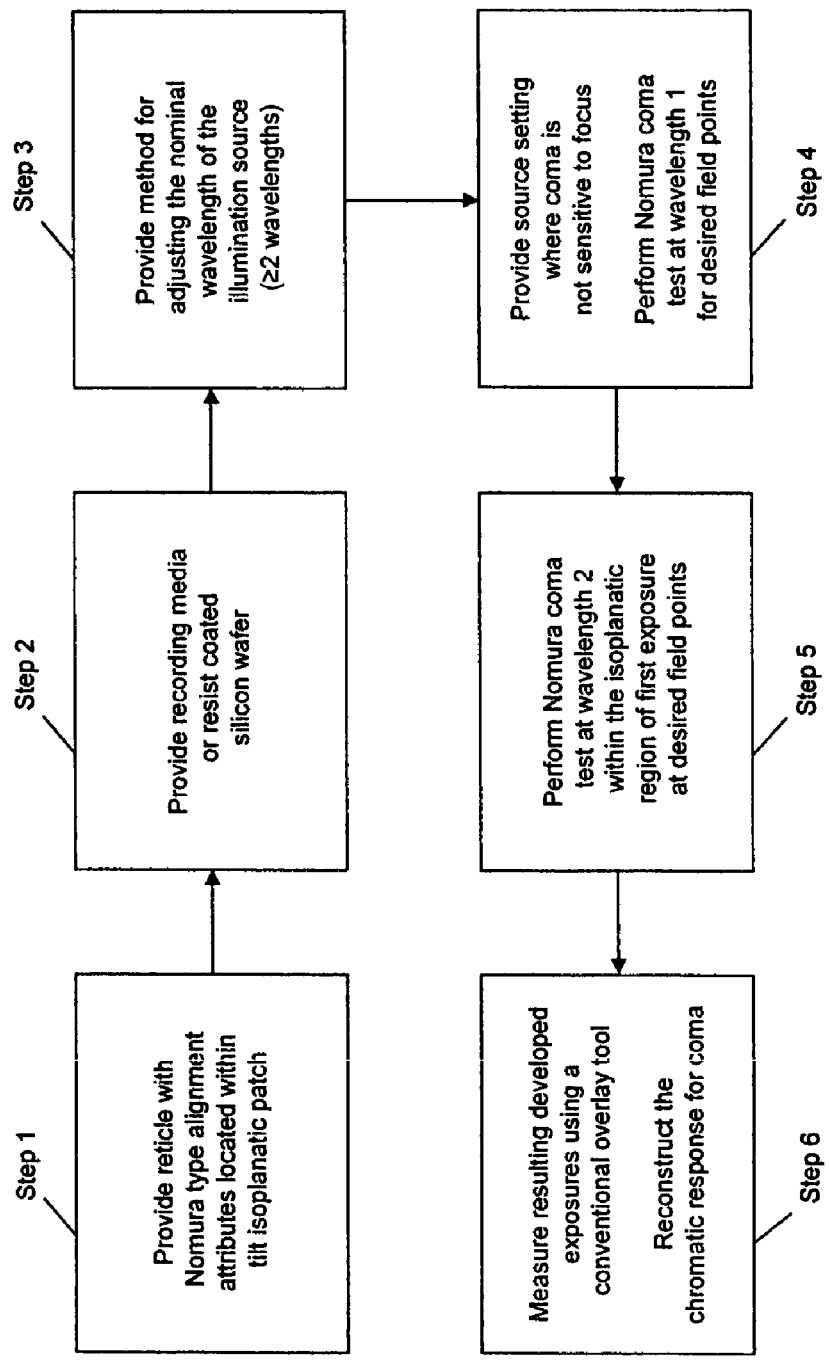
FIG. 15 is a block diagram illustrating an embodiment for determining chromatic response of a lithographic projection system using Nomura.
Figure 17:
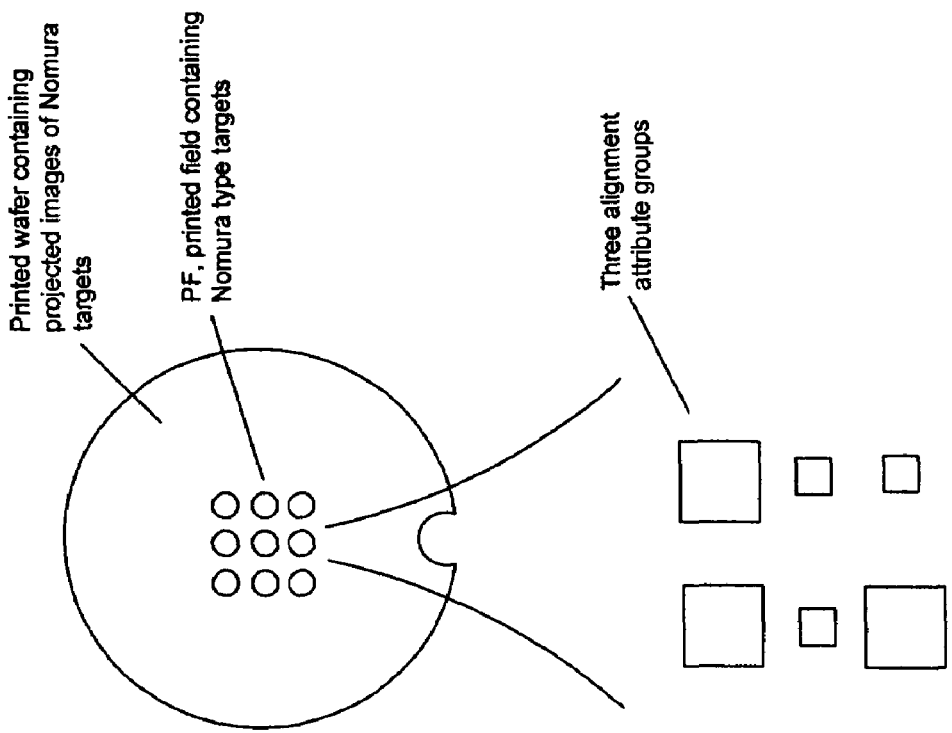
FIG. 17 is a diagram illustrating a printed wafer and detail of a single projected field point for an embodiment for Nomura type patterns.
Figure 16:
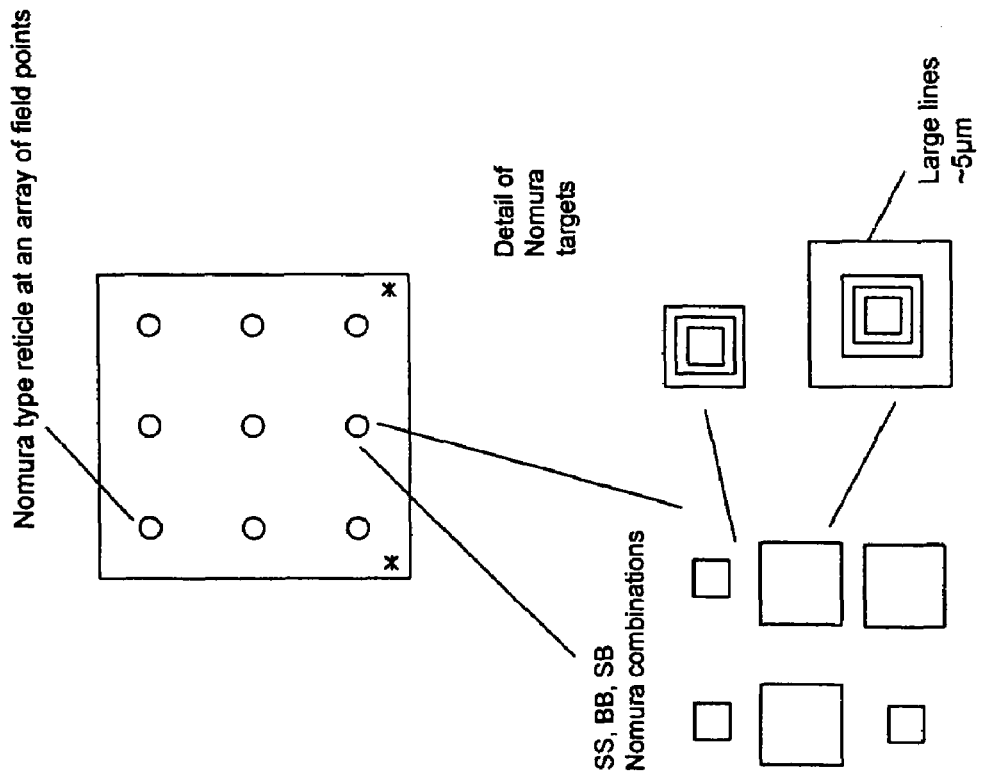
FIG. 16 is a diagram illustrating an embodiment for Nomura type patterns.

In another embodiment, chromatic response to coma aberrations using Nomura targets is described (FIGS. 15, 16, and 17). FIG. 15 is a block diagram illustrating an embodiment for determining chromatic response of a lithographic projection system using Nomura. FIG. 16 is a diagram illustrating an embodiment for Nomura type patterns. FIG. 17 is a diagram illustrating a printed wafer and detail of a single projected field point for an embodiment for Nomura type patterns.

If the ISI reticle is not available (see, for example, U.S. Pat. No. 6,356,345, supra, or U.S. Pat. No. 6,573,986, supra) Nomura (overlay) targets can be used to find the chromatic response for low order coma Zernike coefficients (a7 and a8 for example) as a function of field position. Here we follow the work as described in see, for example, H. Nomura et al., "Overlay Error Due to Lens Coma and Asymmetric Illumination Dependence", *Proc. of SPIE*, Vol. 3332, pp. 199-210, 1998, by simply adjusting the wavelength each time we run the Nomura technique and then map-out the chromatic response to coma aberrations as a function of field position. The basic idea of Nomura is to create box-in-box targets that where the small feature patterns shift relative to large feature patterns (which are assumed to move very little) in the presence of a coma aberration using 3-beam imaging. Nomura uses 3-beam imaging conditions to minimize the impact of focus and asymmetrical illumination during exposure on either dense or isolated Nomura overlay targets. For example, the best conditions for dense line Nomura targets is when sigma is <0.5 or when $\lambda/NA*(1-sigma)<pitch<3*\lambda/NA*(1+sigma)$. Under the assumption of 3-beam imaging Nomura makes use of a very simple two-term Zernike expansion (for coma) and derives the following simple expression for the coma Zernike coefficient: $Z7=(4*P*NA^3*dx)/3*\lambda$ where dx represents the Nomura overlay shift measurement—again, the overlay target. FIG. 15 shows the process for this alternate embodiment.

Chromatic Response Using Scatterometry

Figure 18:
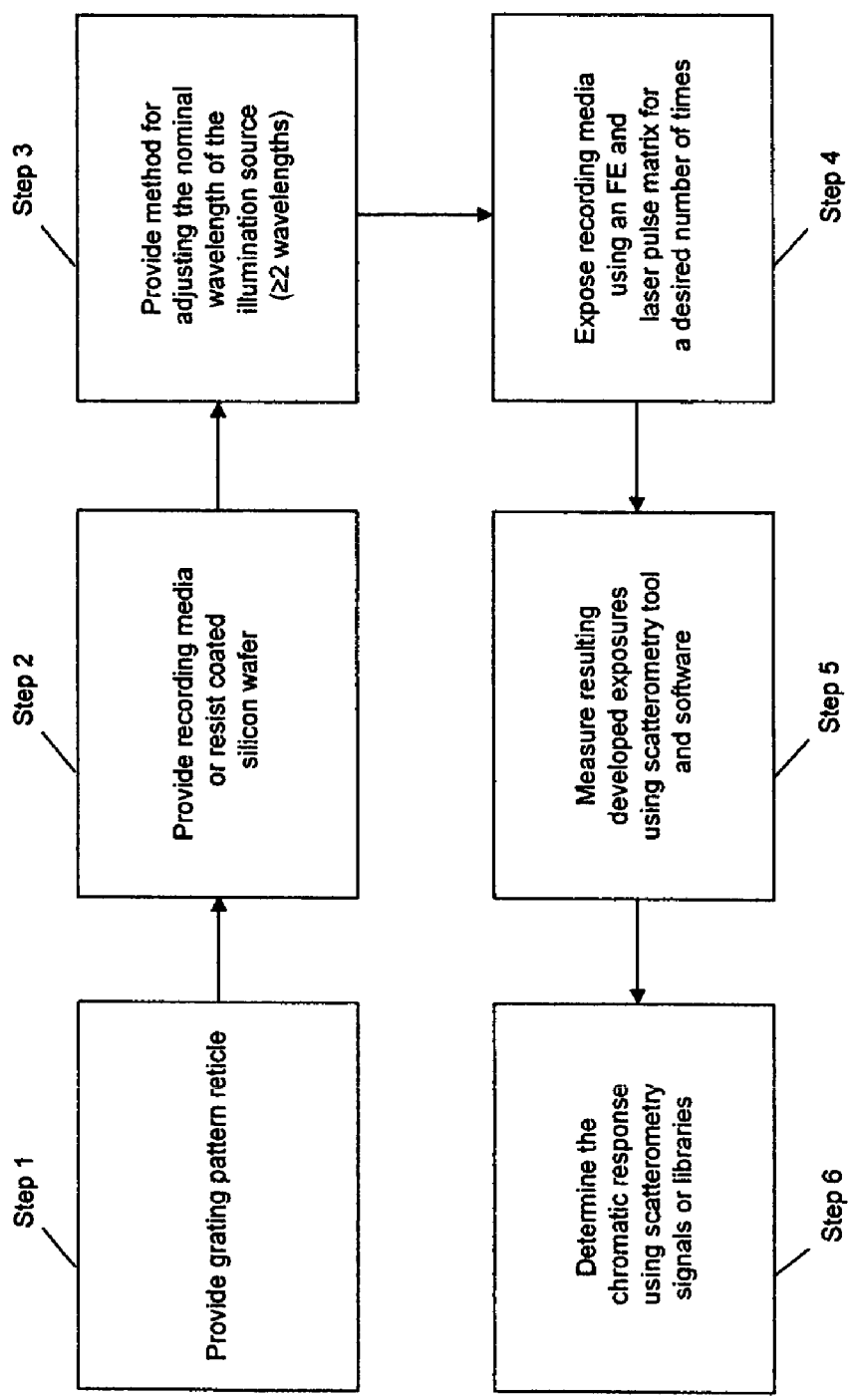
FIG. 18 is a block diagram illustrating steps of an embodiment for machine correction based upon chromatic response.

FIG. 18 is a block diagram illustrating steps of an embodiment for determining chromatic response of a lithographic projection imaging system using scatterometry. Scatterometry is a useful tool for measuring the critical dimensions of lithographic gratings using multi-angle (or multi-wavelength) scatterometry as described in Wang (see, for example, C. Wang et al., "Evaluating Scanner Lens Spherical Aberration using Scatterometer", *Proc. of SPIE*, Vol. 5040-153, pp. 1456-1464, 2003). Additionally, scatterometry (multi-angle or multi-wavelength) can also be used to determine a set of across-field Zernike coefficients (spherical and astigmatism for example) as described in Wang (see, for example, "Evaluating Scanner Lens Spherical Aberration using Scatterometer", supra). So, again, in cases where the ISI is not available the method of the present invention can be modified as shown in FIG. 18 to make use of the method for finding Zernike coefficients as a function of field position and wavelength using scatterometry field signatures.

Chromatic Focus Response

Figure 20:
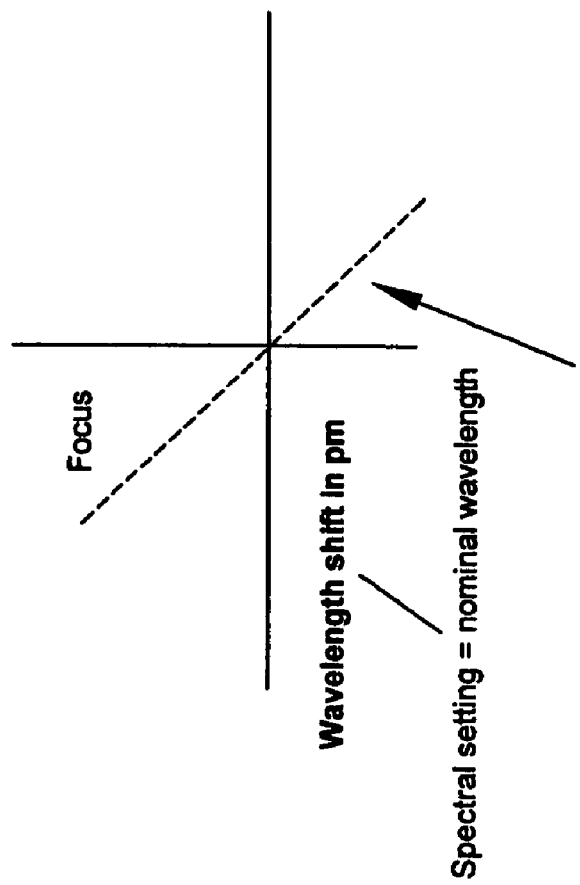
FIG. 20 is a plot illustrating a wavelength shift from nominal verse best focus position.
Figure 19:
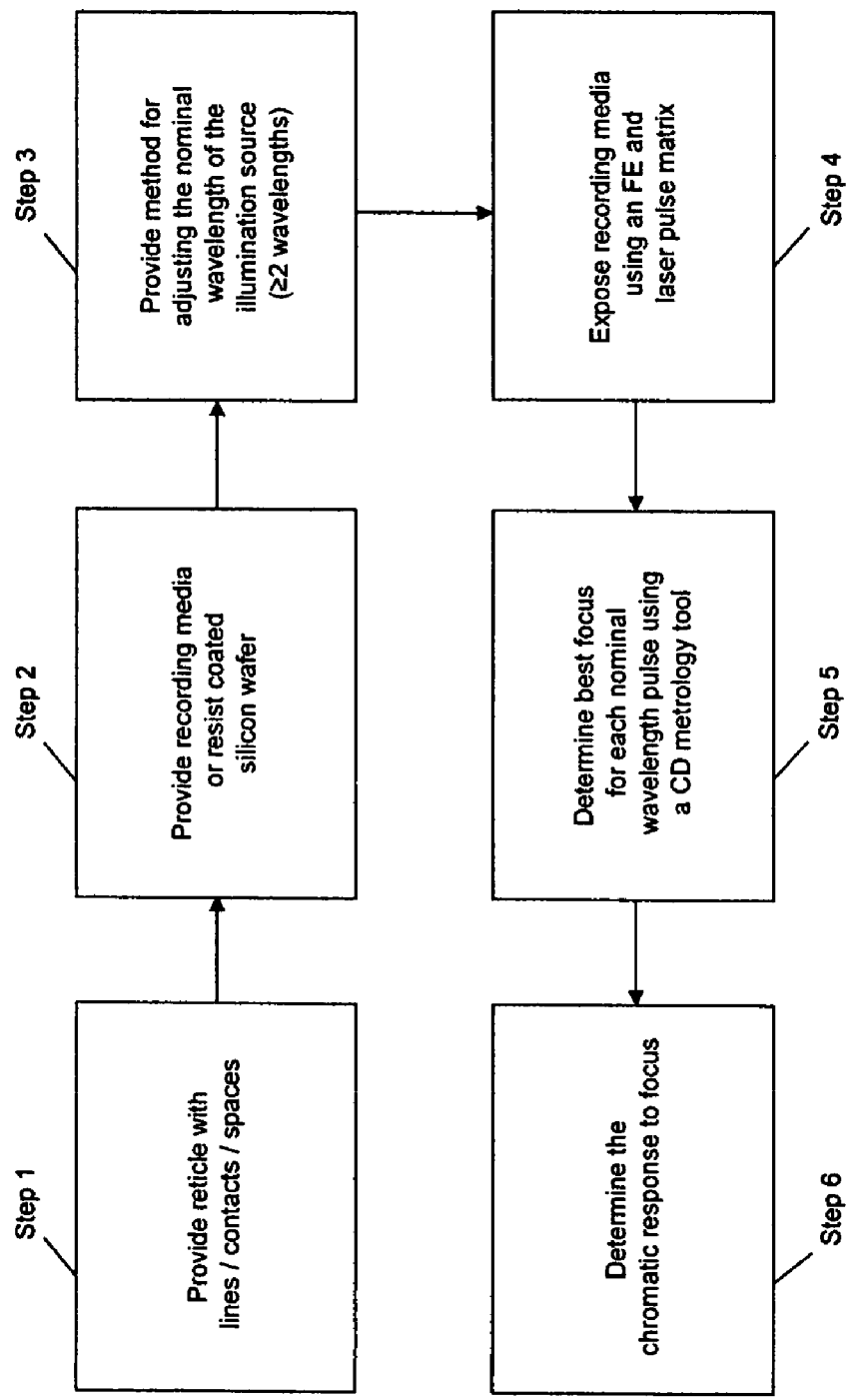
FIG. 19 is a block diagram illustrating steps of another embodiment for determining chromatic response of a lithographic projection imaging system.

FIG. 19 is a block diagram illustrating steps of another embodiment for determining chromatic response of a lithographic projection imaging system. In cases where the ISI is not available but methods for determining best focus as a function of field position are readily available (for example using a CD SEM and FE matrix) one can find the chromatic response to focus and field position as shown in FIG. 19. Here, one simply determines the best focus position using standard fab methodologies (see, for example, "Depth of Focus Enhancement by Wavelength Modulation", supra) for each wavelength and plots the response curve for each field position—thus generating the chromatic response to focus. FIG. 20 is a plot illustrating a wavelength shift from nominal versus best focus position. The curve in FIG. 20 shows chromatic (focus only) response (delta focus/d$\lambda$).

Chromatic Response and Polarization Dependence

Figure 21:
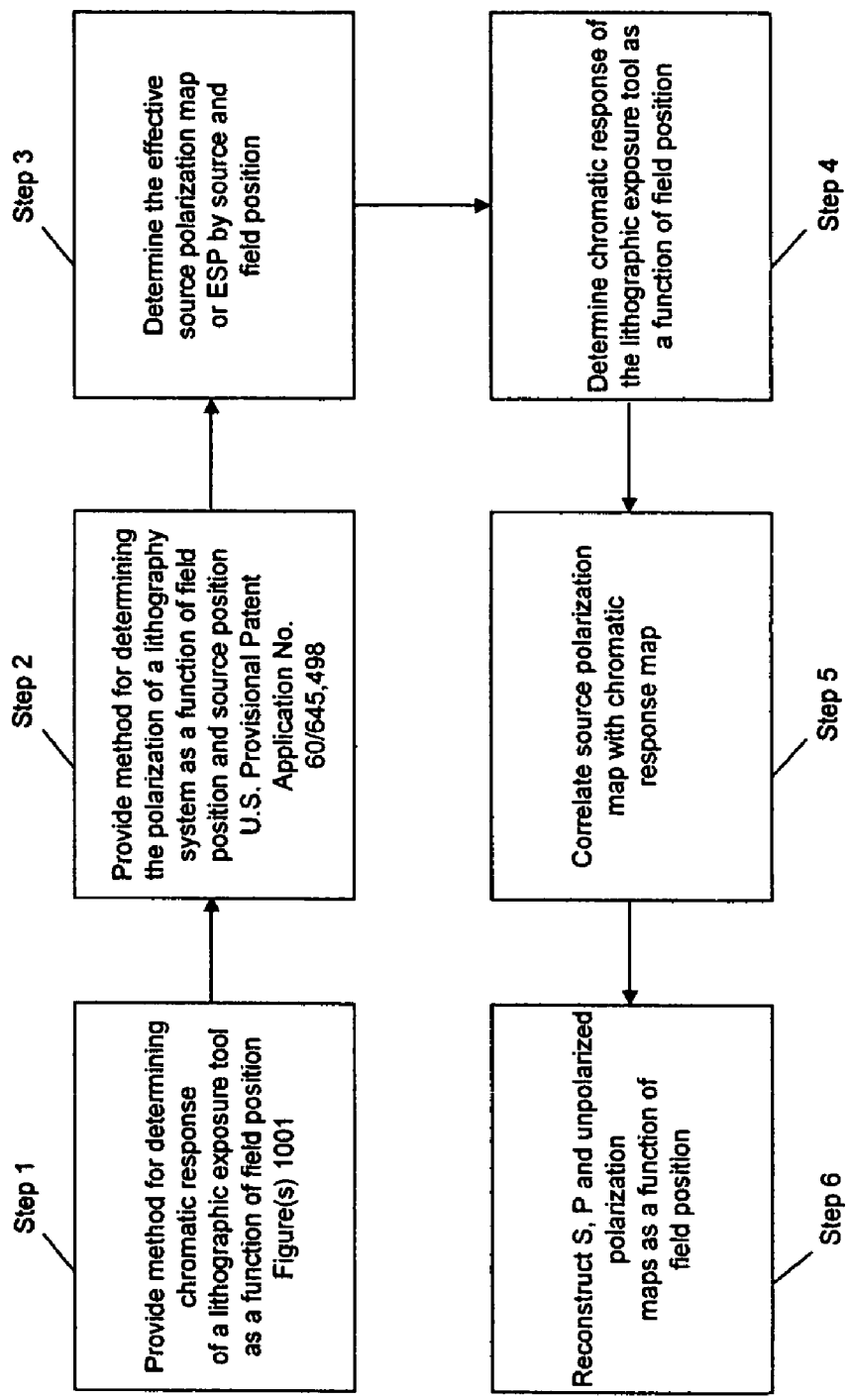
FIG. 21 is a block diagram illustrating steps of an embodiment for producing a chromatic-polarization response map for a lithographic projection imaging system.
Figure 22:
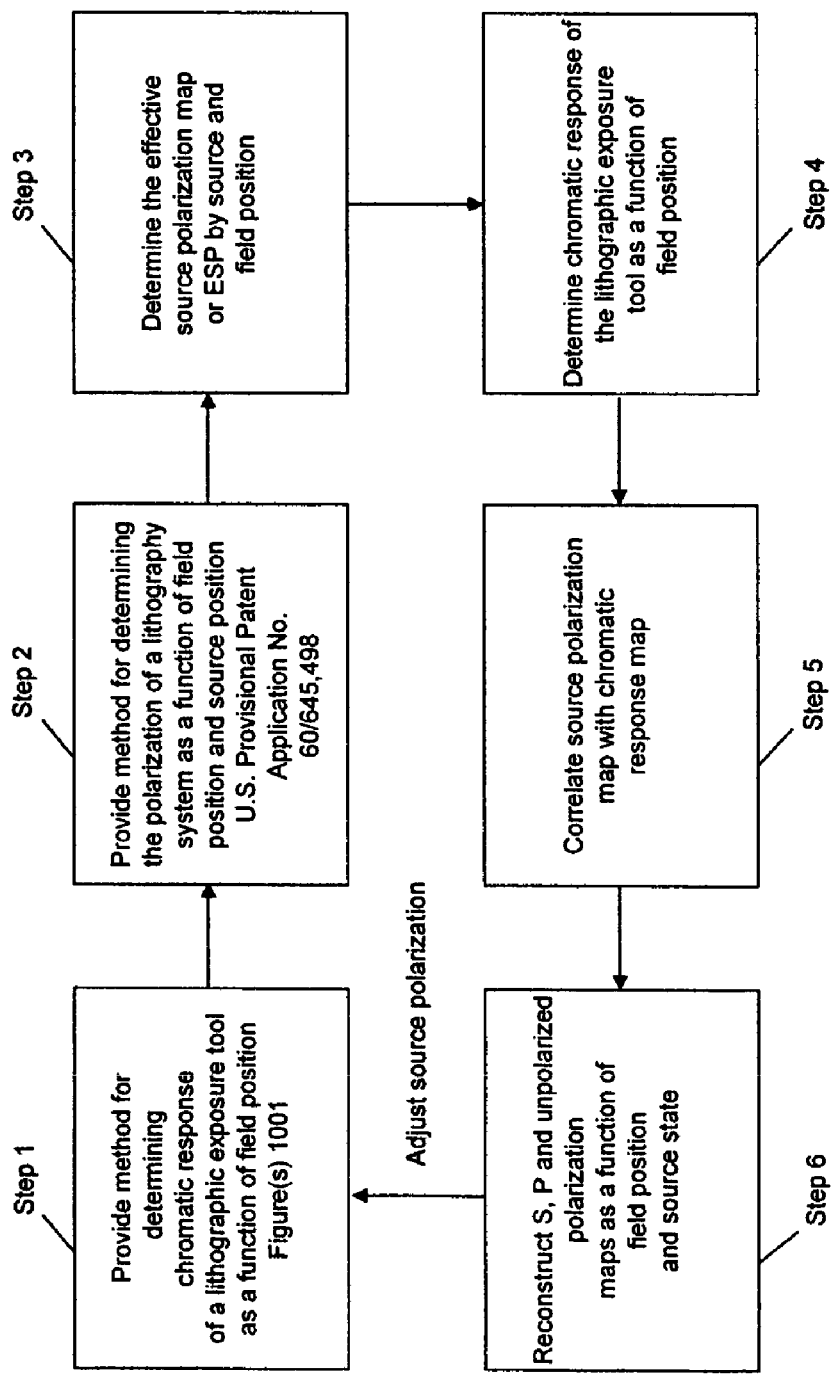
FIG. 22 is a block diagram illustrating steps of an embodiment for producing a chromatic-polarization map with source adjustments for a lithographic projection imaging system.

FIG. 21 is a block diagram illustrating steps of an embodiment for producing a chromatic-polarization response map for a lithographic projection imaging system. FIG. 22 is a block diagram illustrating steps of an embodiment for producing a chromatic-polarization map with source adjustments for a lithographic projection imaging system.

In general, the polarization state of an exposure source (typically, and excimer laser—248 nm or 193 nm) consists of both polarized and un-polarized electromagnetic field components (as a function of source position). For modern state of the art excimer lasers the source polarization can be adjusted at the laser or inside the scanner illumination system or both (ranging from highly polarized to highly un-polarized).

Therefore, if methods exist for determining the polarization at the wafer plane as a function of source position (Sx, Sy) (or simply one knows from optical design the state of polarization at the wafer plane) one can also map the chromatic response for a known polarization state as a function of pupil/source position and field position (at the wafer plane) using the methods of the main embodiment (simply assigning the chromatic results to the known polarization states—Zernike maps for each polarization state for each wavelength). Here however, we understand that each polarization state has quite possibly a different chromatic response (Zernike expansion with wavelength) since polarization is in general, wavelength dependent—in general then we have the Zernikes as a function of (λ, Sx, Sy, P, FP)—where Sx and Sy are source/pupil positions, P is the polarization state at a given field point (FP). So far, the methods of main embodiments effectively map-out the chromatic response for light of any given state (given by the generalized Stokes parameters, Mueller matrix, Jones vector, or a coherency matrix) we now add an additional embodiment when methods for adjusting the polarization state of the light source are possible. There are several cases to consider for determining the chromatic response with polarization effects:

1) Polarization at the wafer plane (as a function of source position) is known or determined: in this case, since the polarization is known, the chromatic response as a function of source (and field position) position can be obtained using the methods of the main embodiment. It should be mentioned since the source polarization map at the entrance pupil differs from the polarization map at the exit pupil due to (known) polarization changes in the optical column—the chromatic Zernike response represents the polarization response on the exit pupil side. Additionally, since the ISI samples a small portion of the source during chromatic reconstruction the resulting polarization map is unique to the actual source portion captured by the ISI (see, for example, U.S. Pat. No. 5,828,455, supra, and U.S. Pat. No. 5,978,085, supra).

2) Only the polarization at entrance pupil is known or determined: in this case, since the polarization of the exposure source changes as it passes through the system optics (in some unknown way) one can determine the chromatic response and polarization map for a given source position in terms of Zernike expansions for each wavelength and state (S, P and un-polarized) but here only represent estimates of the polarization map on the exit pupil side.

3) The polarization at the laser source (i.e. polarization prior to litho machine) is known: in this case, we can only determine the chromatic response and polarization map if we can calculate the change in polarization as a function of optical path to the wafer.

In general, and in practice, mapping the polarization of the optical system can most easily be measured at three or more positions: 1) excimer source output—before the scanner optics, 2) illuminator output—at the reticle, and 3) optical system output—wafer plane.

Methods for determining the polarization as a function of field position and pupil position are described in (see, for example, A. Smith et al., "Method and Apparatus for Determination of Source Polarization Matrix", U.S. Provisional Patent Application No. 60/645,498, 2005). Using these methods one can determine the chromatic response for each mapped polarization state using the methods of the main embodiment as illustrated in FIG. 21. Additionally, if one has control of the polarization at the wafer plane (possibly as a function of source position by adjusting the source or optics) then, in principle, one can determine the chromatic response for many different source configurations (S, P, un-polarized) at each field position (FIG. 22).

Figure 23:
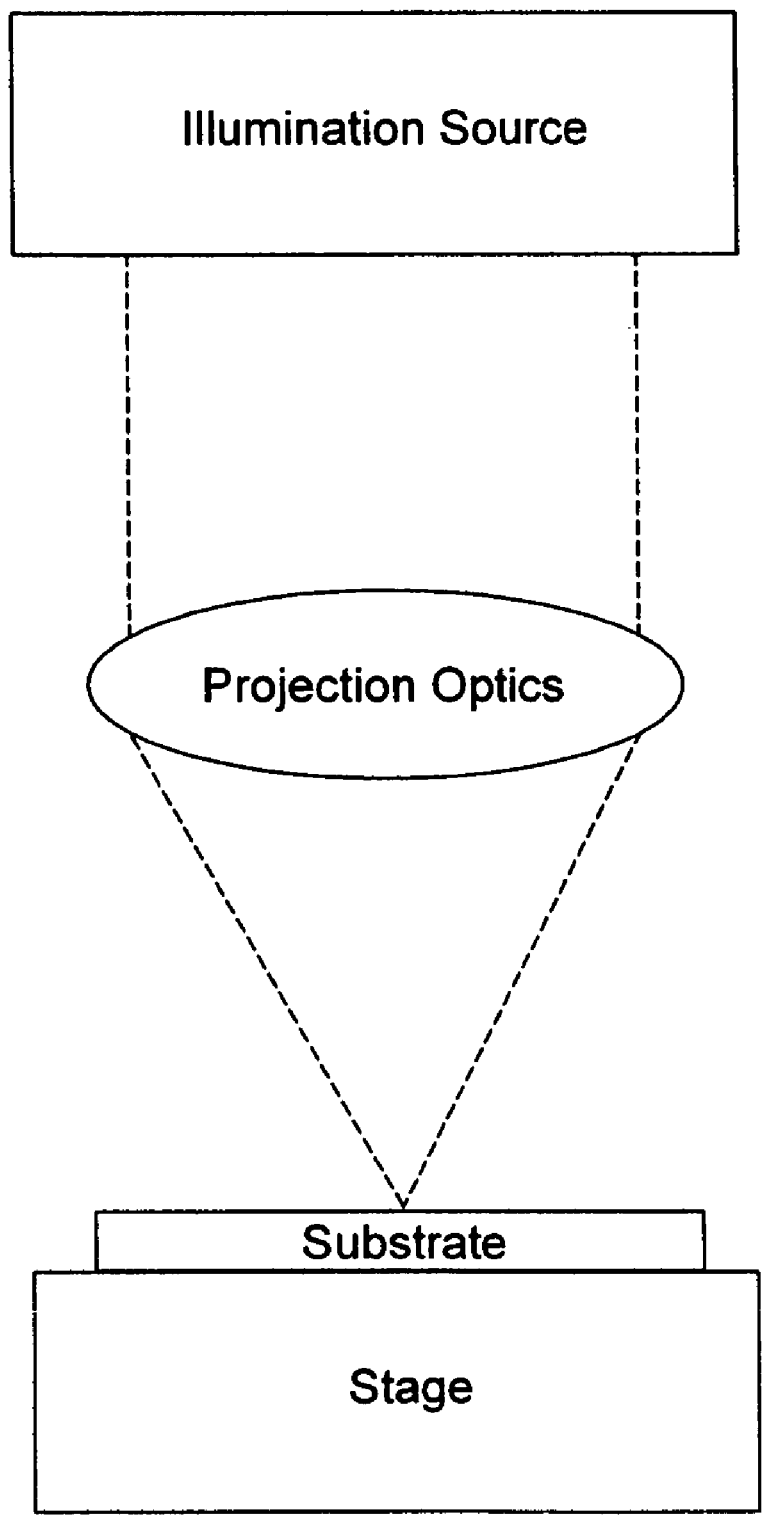
FIG. 23 is a schematic of a projection imaging system showing various functional blocks.

FIG. 23 is a block diagram illustrating portions of a photolithographic projection imaging system. As shown in FIG. 23 the system includes an illumination source, projection optics and a substrate. The illumination source may have adjustable spectral settings. For example, the wavelength of the illumination source can be adjusted, by using optical filters. Additionally, the illumination source polarization, spectral shape (wavelength vs. intensity), and spectral distribution (intensity vs. spatial position) can also be adjusted.

The projection optics form an image of a pattern illuminated by the illumination source. For example, the projection optics may form an image of a reticle pattern that is illuminated by the illumination source. Images of the pattern exposed, by the illumination source at different spectral settings, are formed onto a substrate with a recording media. The substrate may be located on a stage allowing the substrate to be moved to a desired location. Measurements of the exposed patterns may be used in determining chromatic response of the projection imaging system.

The foregoing description details certain embodiments of the invention. It will be appreciated, however, that no matter how detailed the foregoing appears, the invention may be embodied in other specific forms without departing from its spirit or essential characteristics. The described embodiments are to be considered in all respects only as illustrative and not restrictive and the scope of the invention is, therefore, indicated by the appended claims rather than by the foregoing description. All changes, which come with the meaning and range of equivalency of the claims, are to be embraced within their scope.

We claim:

1. A method of determining chromatic response of a projection imaging system, the method comprising:
exposing a first pattern with an illumination source configured at a first wavelength onto a substrate with a recording media;
exposing a second pattern with the illumination source configured at a second wavelength onto the substrate;
measuring the exposed patterns; and
determining chromatic response of the projection imaging system based upon the measurements.

2. A method as defined in claim 1, further comprising repeating exposing patterns at different wavelengths a desired number of times.

3. A method as defined in claim 1, wherein measuring the exposed patterns comprises ISI01, ISI02, SPIN, ARTEMIS, ISIS, multi-wavelength scatterometry, multi-angle scatterometry, Nomura, or FE matrix.

4. A method as defined in claim 1, wherein exposing the patterns comprises ILIAS, P-PMI, or PMI.

5. A method as defined in claim 1, wherein the substrate is a semiconductor surface, a silicon wafer, a flat panel display, a reticle, a photolithographic mask, or an electronic recording media.

6. A method as defined in claim 1, wherein the projection imaging system is used in a photolithographic stepper system, a photolithographic scanner system, a one dimensional scanner, a two dimensional scanner, an electronic beam imaging system, an extreme ultra-violet photolithographic tool, an EPL machine, or an image side immersion lens, or an x-ray imaging system.

7. A method as defined in claim 1, wherein the recording media is a negative resist material, a positive resist material, an electronic CCD, a liquid crystal material, or an optically sensitive material.

8. A method of determining chromatic response of a projection imaging system, the method comprising:
   exposing a first pattern with an illumination source with a first spectral setting onto a substrate with a recording media;
   exposing a second pattern with the illumination source configured with a second spectral setting onto the substrate;
   measuring the exposed patterns; and
   determining chromatic response of the projection imaging system based upon the measurements.

9. A method as defined in claim 8, further comprising repeating exposing patterns at different spectral settings a desired number of times.

10. A method as defined in claim 8, wherein spectral settings comprise the illumination source nominal wavelength, spectral shape, bandwidth, pulse duration, pulse number, polarization, or spatial energy distribution.

11. A method as defined in claim 8, wherein spectral settings comprise a focus matrix.

12. A method as defined in claim 8, wherein spectral settings comprise an exposure matrix.

13. A method as defined in claim 8, wherein measuring the exposed patterns comprises ISI01, ISI02, SPIN, ARTEMIS, ISIS, multi-wavelength scatterometry, multi-angle scatterometry, Nomura, or FE matrix.

14. A method as defined in claim 8, wherein exposing the patterns comprises ILIAS, P-PMI, or PMI.

15. A method as defined in claim 8, wherein the substrate is a semiconductor surface, a silicon wafer, a flat panel display, a reticle, a photolithographic mask, or an electronic recording media.

16. A method as defined in claim 8, wherein the projection imaging system is used in a photolithographic stepper system, a photolithographic scanner system, a one dimensional scanner, a two dimensional scanner, an electronic beam imaging system, an extreme ultraviolet photolithographic tool, an EPL machine, or an image side immersion lens, or an x-ray imaging system.

17. A method as defined in claim 8, wherein the recording media is a negative resist material, a positive resist material, an electronic CCD, a liquid crystal material, or an optically sensitive material.

18. A method of determining chromatic response of a projection imaging system, the method comprising:
   providing a reticle with a pattern;
   exposing a first reticle pattern with an illumination source with a first spectral setting 15 onto a substrate with a recording media;
   exposing a second reticle pattern with the illumination source configured with a second spectral setting onto the substrate, wherein the exposures comprise a focus and exposure matrix;
   measuring the exposed reticle patterns, wherein measuring comprising critical dimension measurements of the exposed patterns; and
   determining chromatic response of the projection imaging system based upon the measurements.

19. A method as defined in claim 18, wherein the reticle pattern comprises a line/space pattern or a contact hole pattern.

20. A method as defined in claim 18, wherein determining chromatic response comprises determining the optimum focus for each spectral setting using an interferometer system.

21. A method as defined in claim 20, wherein the projection imaging system comprises the interferometer system.

22. A method of determining chromatic response of a projection imaging system, the method comprising:
   providing a first reticle with an ISIO pattern and a second reticle with an ISII pattern;
   exposing the ISIO pattern with an illumination source with a first spectral setting onto a substrate with a recording media;
   exposing the ISII pattern with the illumination source configured with a second spectral setting onto the substrate, wherein the exposed ISII pattern overlays the exposed ISIO pattern thereby forming completed alignment attributes;
   measuring the exposed completed alignment attributes; and
   determining chromatic response of the projection imaging system based upon the 20 measurements.

23. Method of determining chromatic response of a projection imaging system, the method comprising:
   providing a reticle with a first set of alignment attributes and a second set of alignment attributes, wherein the first and second sets of alignment attributes are complementary;
   exposing the first set of alignment attributes with an illumination source with a first spectral setting onto a substrate with a recording media;
   exposing the second set of alignment attributes with the illumination source configured with a second spectral setting onto the substrate, wherein the exposed second set of alignment
   attributes overlays the exposed first set of alignment attributes thereby forming completed alignment attributes;
   measuring the exposed completed alignment attributes; and
   determining chromatic response of the projection imaging system based upon the measurements.

24. A method as defined in claim 23, wherein the first set of alignment attributes comprise inner overlay targets and the second set of alignment attributes comprise outer alignment attributes.

25. A method as defined in claim 23, wherein the first set of alignment attributes comprise outer overlay targets and the second set of alignment attributes comprise inner alignment attributes.

26. A method as defined in claim 23, wherein spectral settings are adjusted to minimize coma effects of the illumination source.

27. A method as defined in claim 23, wherein the chromatic response is in terms of Zernike expansions.

28. A method of optimizing a chromatic photolithographic chip mask work from a lithographic machine, the method comprising:
   exposing a first pattern with an illumination source with a first spectral setting onto a substrate with a recording media;
   exposing a second pattern with the illumination source configured with a second spectral setting onto the substrate;
   measuring the exposed patterns;
   determining chromatic response of the projection imaging system based upon the measurements;

determining a set of spectral settings that optimize lithographic performance metrics of the lithographic machine.

29. A method as defined in claim 28, wherein the spectral settings comprise depth of focus or iso-dense bias.

30. A method as defined in claim 28, wherein determining the set of spectral settings that optimize lithographic performance metrics comprises a lithography process simulator.

31. A method as defined in claim 28, wherein the lithographic machine comprises a stepper, a one dimensional scanner, a two dimensional scanner, an E V scanner, an EPL machine, or an image side immersion lens.

* * * * *

UNITED STATES PATENT AND TRADEMARK OFFICE
CERTIFICATE OF CORRECTION

| | | |
|---|---|---|
| PATENT NO. | : 7,544,449 B1 | Page 1 of 1 |
| APPLICATION NO. | : 11/280531 | |
| DATED | : June 9, 2009 | |
| INVENTOR(S) | : Adlai H. Smith, Robert O. Hunter, Jr. and Joseph J. Bendik, Jr. | |

It is certified that error appears in the above-identified patent and that said Letters Patent is hereby corrected as shown below:

IN THE CLAIMS

Please replace Claims 23 and 32 as follows:

23.  A method of determining chromatic response of a projection imaging system, the method comprising:
providing a reticle with a first set of alignment attributes and a second set of alignment attributes, wherein the first and second sets of alignment attributes are complementary;
exposing the first set of alignment attributes with an illumination source with a first spectral setting onto a substrate with a recording media;
exposing the second set of alignment attributes with the illumination source configured with a second spectral setting onto the substrate, wherein the exposed second set of alignment
attributes overlays the exposed first set of alignment attributes thereby forming completed alignment attributes;
measuring the exposed completed alignment attributes; and
determining chromatic response of the projection imaging system based upon the measurements.

32.  A method as defined in Claim 29, wherein the lithographic machine comprises a stepper, a one dimensional scanner, a two dimensional scanner, an ~~EV~~ EUV scanner, an EPL machine, or an image side immersion lens.

Signed and Sealed this

Fourteenth Day of July, 2009

JOHN DOLL
*Acting Director of the United States Patent and Trademark Office*

UNITED STATES PATENT AND TRADEMARK OFFICE
CERTIFICATE OF CORRECTION

| | | |
|---|---|---|
| PATENT NO. | : 7,544,449 B1 | Page 1 of 2 |
| APPLICATION NO. | : 11/280531 | |
| DATED | : June 9, 2009 | |
| INVENTOR(S) | : Adlai H. Smith, Robert O. Hunter, Jr. and Joseph J. Bendik, Jr. | |

It is certified that error appears in the above-identified patent and that said Letters Patent is hereby corrected as shown below:

IN THE CLAIMS

Please replace Claims 23 and 31 as follows:

Column 22, lines 22-42 should read

23. A method of determining chromatic response of a projection imaging system, the method comprising:

providing a reticle with a first set of alignment attributes and a second set of alignment attributes, wherein the first and second sets of alignment attributes are complementary;

exposing the first set of alignment attributes with an illumination source with a first spectral setting onto a substrate with a recording media;

exposing the second set of alignment attributes with the illumination source configured with a second spectral setting onto the substrate, wherein the exposed second set of alignment attributes overlays the exposed first set of alignment attributes thereby forming completed alignment attributes;

measuring the exposed completed alignment attributes; and determining chromatic response of the projection imaging system based upon the measurements.

UNITED STATES PATENT AND TRADEMARK OFFICE
CERTIFICATE OF CORRECTION

PATENT NO. : 7,544,449 B1
APPLICATION NO. : 11/280531
DATED : June 9, 2009
INVENTOR(S) : Adlai H. Smith, Robert O. Hunter, Jr. and Joseph J. Bendik, Jr.

It is certified that error appears in the above-identified patent and that said Letters Patent is hereby corrected as shown below:

Column 24, lines 1-4 should read
31. A method as defined in Claim 28, wherein the lithographic machine comprises a stepper, a one dimensional scanner, a two dimensional scanner, an ~~EV~~ EUV scanner, an EPL machine, or an image side immersion lens.

This certificate supersedes the Certificate of Correction issued July 14, 2009.

Signed and Sealed this

Eighteenth Day of August, 2009

David J. Kappos
*Director of the United States Patent and Trademark Office*